(12) United States Patent
Hsu

(10) Patent No.: US 11,894,268 B2
(45) Date of Patent: Feb. 6, 2024

(54) METHOD FOR FABRICATING SEMICONDUCTOR DEVICE WITH INTERVENING LAYER

(71) Applicant: NANYA TECHNOLOGY CORPORATION, New Taipei (TW)

(72) Inventor: Ping Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 53 days.

(21) Appl. No.: 17/573,793

(22) Filed: Jan. 12, 2022

(65) Prior Publication Data

US 2022/0139777 A1 May 5, 2022

Related U.S. Application Data

(62) Division of application No. 17/004,902, filed on Aug. 27, 2020, now Pat. No. 11,574,841.

(51) Int. Cl.
| | | |
|---|---|---|
| *H01L 21/768* | (2006.01) | |
| *H01L 23/535* | (2006.01) | |
| *H01L 23/532* | (2006.01) | |
| *H01L 21/3213* | (2006.01) | |
| *H01L 23/528* | (2006.01) | |

(52) U.S. Cl.
CPC .. *H01L 21/76889* (2013.01); *H01L 21/32133* (2013.01); *H01L 21/76895* (2013.01); *H01L 23/5283* (2013.01); *H01L 23/535* (2013.01); *H01L 23/53209* (2013.01)

(58) Field of Classification Search
CPC .............. H01L 21/76889; H01L 23/53209
See application file for complete search history.

(56) References Cited

U.S. PATENT DOCUMENTS

| | | | | |
|---|---|---|---|---|
| 9,929,249 B1 | * | 3/2018 | Ahn | ............ H01L 29/665 |
| 2008/0079090 A1 | * | 4/2008 | Hwang | ............ H01L 21/76889 |
| | | | | 257/E21.409 |
| 2015/0171206 A1 | | 6/2015 | van Dal | |
| 2018/0040559 A1 | * | 2/2018 | Chang | ............ H01L 23/53257 |
| 2019/0164887 A1 | | 5/2019 | Wang et al. | |
| 2019/0267284 A1 | | 8/2019 | Lee et al. | |
| 2020/0098591 A1 | * | 3/2020 | Lin | ............ H01L 21/76805 |
| 2021/0167004 A1 | | 6/2021 | Seo et al. | |

FOREIGN PATENT DOCUMENTS

| | | | |
|---|---|---|---|
| TW | 201025588 A | | 7/2010 |
| TW | 202025245 A | | 7/2020 |

OTHER PUBLICATIONS

Office Action dated Mar. 22, 2022 related to U.S. Appl. No. 17/004,902, wherein this application is a Div of U.S. Appl. No. 17/004,902.

(Continued)

*Primary Examiner* — Farun Lu
(74) *Attorney, Agent, or Firm* — Xuan Zhang

(57) ABSTRACT

A method for fabricating the semiconductor device includes providing a substrate, forming a bottom conductive plug on the substrate, forming a semiconductor layer on the bottom conductive plug, rounding a top surface of the semiconductor layer, turning the semiconductor layer into an intervening conductive layer, and forming a top conductive plug on the intervening conductive layer

8 Claims, 31 Drawing Sheets

(56) References Cited

OTHER PUBLICATIONS

Office Action dated Jun. 10, 2022 related to U.S. Appl. No. 17/004,902, wherein this application is a Div of U.S. Appl. No. 17/004,902.
Office Action dated Aug. 8, 2022 related to U.S. Appl. No. 17/004,902, wherein this application is a Div of U.S. Appl. No. 17/004,902.

* cited by examiner

METHOD FOR FABRICATING
SEMICONDUCTOR DEVICE WITH
INTERVENING LAYER

CROSS-REFERENCE TO RELATED
APPLICATION

This application is a divisional application of U.S. Non-Provisional application Ser. No. 17/004,902 filed Aug. 27, 2020, which is incorporated herein by reference in its entirety.

TECHNICAL FIELD

The present disclosure relates to a method for fabricating a semiconductor device, and more particularly, to a method for fabricating a semiconductor device with an intervening layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a bottom conductive plug positioned on the substrate, an intervening conductive layer positioned on the bottom conductive plug, and a top conductive plug positioned on the intervening conductive layer. A top surface of the intervening conductive layer is non-planar.

In some embodiments, a bottom surface of the top conductive plug is complementary to the top surface of the intervening conductive layer.

In some embodiments, the top surface of the intervening conductive layer is convex, and the bottom surface of the top conductive plug is concave.

In some embodiments, the top surface of the intervening conductive layer is concave, and the bottom surface of the top conductive plug is convex.

In some embodiments, a bottom surface of the intervening conductive layer is substantially planar, and sidewalls of the intervening conductive layer are tapered along a vertical direction.

In some embodiments, an angle between the sidewalls of the intervening conductive layer and the bottom surface of the intervening conductive layer is between 60 degree and about 80 degree.

In some embodiments, the intervening conductive layer is formed of metal silicide.

In some embodiments, a width of the intervening conductive layer is equal to or less than a width of the bottom conductive plug.

In some embodiments, a width of the top conductive plug is equal to or less than the width of the intervening conductive layer.

In some embodiments, an aspect ratio of the bottom conductive plug is less than about 1:4.

In some embodiments, an aspect ratio of the top conductive plug is less than about 1:4.

In some embodiments, a ratio of a radius of curvature of the top surface of the intervening conductive layer to a height of the intervening conductive layer is between about 1:1 and about 1:4.

In some embodiments, a ratio of the height of the intervening conductive layer to a height of the top conductive plug is between about 1:3 and about 1:6.

In some embodiments, the intervening conductive layer includes a lower portion positioned on the bottom conductive plug and an upper portion positioned on the lower portion. A top surface of the upper portion is concave, and a bottom surface of the upper portion is concave.

In some embodiments, a central line of the top conductive plug is offset from a central line of the intervening conductive layer.

Another aspect of the present disclosure provides a method for fabricating a semiconductor device including providing a substrate, forming a bottom conductive plug on the substrate, forming a semiconductor layer on the bottom conductive plug, rounding a top surface of the semiconductor layer, turning the semiconductor layer into an intervening conductive layer, and forming a top conductive plug on the intervening conductive layer.

In some embodiments, the semiconductor layer is formed of polycrystalline silicon, polycrystalline germanium, or polycrystalline silicon-germanium.

In some embodiments, the intervening conductive layer is formed of metal silicide.

In some embodiments, the step of turning the semiconductor layer into the intervening conductive layer includes forming a layer of conductive material covering the semiconductor layer, and performing a thermal treatment to react the layer of conductive material with the semiconductor layer and turn the semiconductor layer into the intervening conductive layer.

In some embodiments, an anisotropic etch process is performed to round the top surface of the semiconductor layer.

Due to the design of the semiconductor device of the present disclosure, the semiconductor device including the intervening conductive layers may have greater pattern density. In addition, the non-planar top surface of the intervening conductive layers may also reduce the contact resistance between the intervening conductive layers and the top conductive plugs. Accordingly, the power consumption of the semiconductor device may be reduced. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
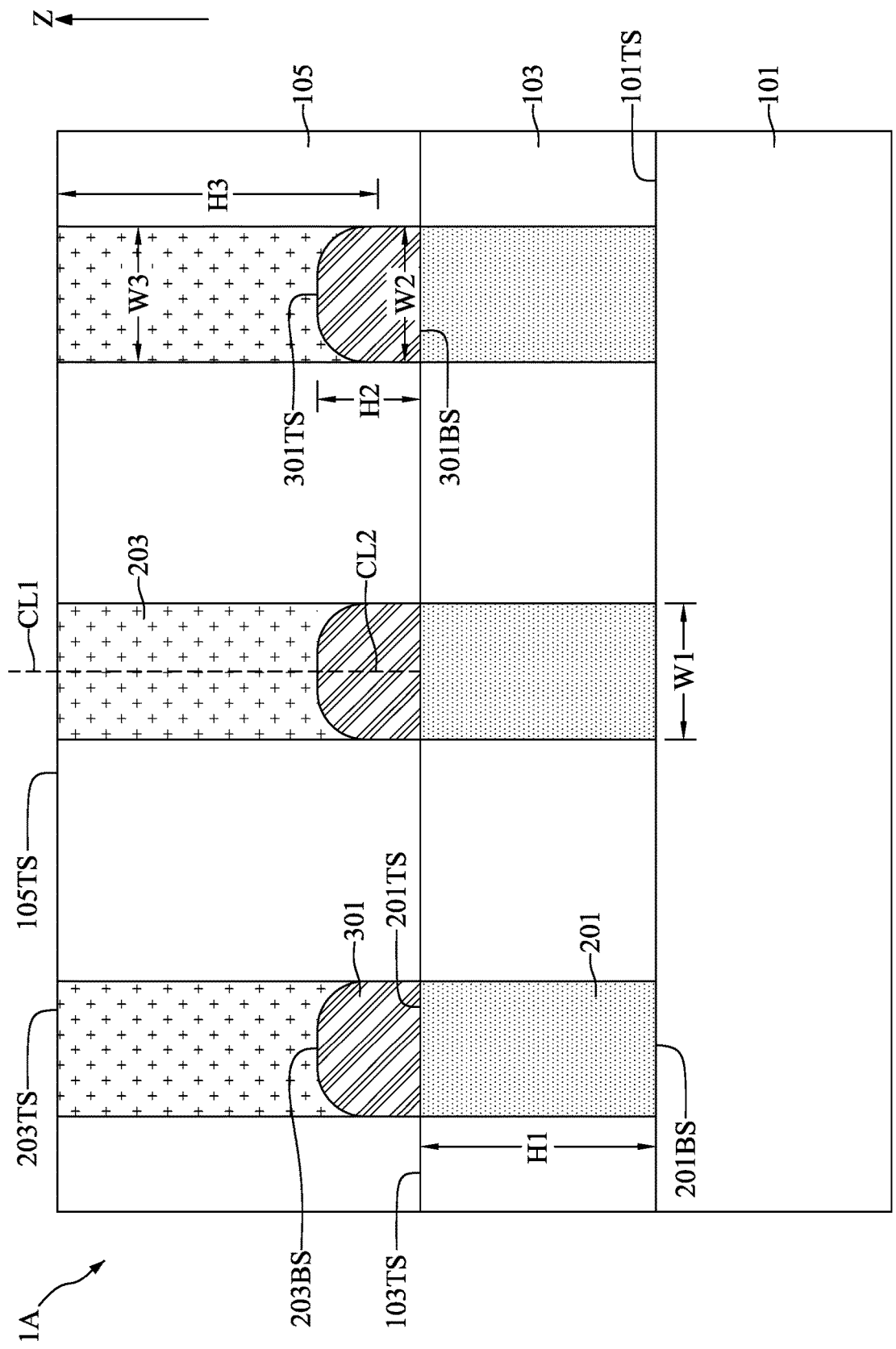
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device 1A in accordance with one embodiment of the present disclosure.

With reference to FIG. 1, the semiconductor device 1A may include a substrate 101, a first insulating layer 103, a second insulating layer 105, bottom conductive plugs 201, top conductive plugs 203, and intervening conductive layers 301.

With reference to FIG. 1, in some embodiments, the substrate 101 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

In some embodiments, the substrate 101 may include dielectrics, insulating layers, or conductive features disposed on the bulk semiconductor substrate or the topmost semiconductor material layer. The dielectrics or the insulating layers may be formed of, for example, silicon oxide, borophosphosilicate glass, undoped silicate glass, fluorinated silicate glass, low-k dielectric materials, the like, or a combination thereof. Each of the dielectrics or each of the insulating layers may have a thickness between about 0.5 micrometer and about 3.0 micrometer. The low-k dielectric materials may have a dielectric constant less than 3.0 or even less than 2.5. The conductive features may be conductive lines, conductive vias, conductive contacts, or the like.

In some embodiments, device elements (not shown) may be disposed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation.

With reference to FIG. 1, the first insulating layer 103 may be disposed on the substrate 101. The first insulating layer 103 may be formed of, for example, silicon oxide, borophosphosilicate glass, undoped silicate glass, fluorinated silicate glass, low-k dielectric materials, the like, or a combination thereof. The first insulating layer 103 have a thickness between about 0.5 micrometer and about 3.0 micrometer.

With reference to FIG. 1, the second insulating layer 105 may be disposed on the first insulating layer 103. The second insulating layer 105 may be formed of, for example, silicon oxide, borophosphosilicate glass, undoped silicate glass, fluorinated silicate glass, low-k dielectric materials, the like, or a combination thereof. The second insulating layer 105 have a thickness between about 0.5 micrometer and about 3.0 micrometer.

With reference to FIG. 1, the bottom conductive plugs 201 may be disposed in the first insulating layer 103. For convenience of description, only one bottom conductive plug 201 is described. The top surface 201TS of the bottom conductive plug 201 is substantially coplanar with the top surface 103TS. The bottom surface 201BS of the bottom conductive plug 201 may be substantially coplanar with the top surface 101TS of the substrate 101. In other words, the height H1 of the bottom conductive plug 201 may be equal to the height of the first insulating layer 103. A ratio of the width W1 of the bottom conductive plug 201 to the height H1 of the bottom conductive plug 201 (i.e., the aspect ratio of the bottom conductive plug 201) may be less than about 1:4; specifically, may be less than 1:2. The bottom conductive plug 201 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

It should be noted that, in the description of the present disclosure, a "height" refers to a vertical size of an element (e.g., a layer, plug, trench, hole, opening, etc.) in a cross-sectional perspective measured from a top surface to a bottom surface of the element; a "width" refers to a size of an element (e.g., a layer, plug, trench, hole, opening, etc.) in a cross-sectional perspective measured from a side surface to an opposite surface of the element. The term "thickness" may substitute for "width" and/or "height" where indicated.

With reference to FIG. 1, the intervening conductive layers 301 may be respectively correspondingly disposed on the bottom conductive plugs 201 and may be disposed in the second insulating layer 105. For convenience of description, only one intervening conductive layer 301 is described. In some embodiments, the top surface 301TS of the intervening conductive layer 301 may be non-planar. Specifically, in the embodiment depicted, the top surface 301TS of the intervening conductive layer 301 is convex. The convex top surface 301TS of the intervening conductive layer 301 may increase the contact surface between the intervening conductive layer 301 and the top conductive plug 203 as will be illustrated later. The bottom surface 301BS of the intervening conductive layer 301 may be substantially planar and may be substantially coplanar with the top surface 103TS of the first insulating layer 103.

In some embodiments, in a cross-sectional perspective, the intervening conductive layer 301 may have a semi-circular cross-sectional profile or a semi-oval cross-sectional profile. In some embodiments, the intervening conductive layer 301 may be tapered along the direction Z. The width W2 of the intervening conductive layer 301 may be gradually decrease from bottom to top. In some embodiments, the width W2 of the intervening conductive layer 301 may be equal to or less than the width W1 of the bottom conductive plug 201.

It should be noted that, in the description of the present disclosure, a surface is "substantially planar" if there exists a horizontal plane from which the surface does not deviate by more than three times the root mean square roughness of the surface.

In some embodiments, the intervening conductive layer 301 may be formed of, for example, metal silicide. Metal silicide may be, for example, titanium silicide, nickel silicide, nickel platinum silicide, tantalum silicide, or cobalt silicide. In some embodiments, the intervening conductive layer 301 may include impurities such as phosphorus, arsenic, antimony, or boron.

With reference to FIG. 1, the top conductive plugs 203 may be respectively correspondingly disposed on the intervening conductive layers 301 and may be disposed in the second insulating layer 105. For convenience of description, only one top conductive plug 203 is described. The top surface 203TS of the top conductive plug 203 may be substantially coplanar with the top surface 105TS of the second insulating layer 105. A width W3 of the top conductive plug 203 may be equal to or less than the width W2 of the intervening conductive layer 301. The bottom surface 203BS of the top conductive plug 203 may be non-planar and may be complementary to the top surface 301TS of the intervening conductive layer 301. In the embodiment depicted, the bottom surface 203BS of the top conductive plug 203 is concave.

In some embodiments, a ratio of the height H2 of the intervening conductive layer 301 to the height H3 of the top conductive plug 203 may be between about 1:3 and about 1:6. In some embodiments, a ratio of the width W3 of the top conductive plug 203 to the height H3 of the top conductive plug 203 (i.e., the aspect ratio of the top conductive plug 203) may be less than about 1:4; specifically, may be less than 1:2. In some embodiments, the central line CL1 of the top conductive plug 203 may be aligned with the central line CL2 of the intervening conductive layer 301. In other words, the top conductive plug 203 may be symmetrically disposed on the intervening conductive layer 301.

The top conductive plugs 203 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

In some embodiments, the bottom conductive plug 201, the intervening conductive layer 301, and the top conductive plug 203 may together to electrically connect a device element disposed above the second insulating layer 105 and a device element disposed in the substrate 101. For example, the bottom conductive plug 201, the intervening conductive layer 301, and the top conductive plug 203 may together to serve as a bit line contact in a dynamic random-access memory.

Conventionally, in order to electrically connect a device element disposed above the second insulating layer 105 and a device element disposed in the substrate 101, a conventional plug, disposed along the second insulating layer 105 and the first insulating layer 103, may be employed to electrically connect aforementioned device elements. However, as the dimensions of semiconductor devices are continuously being scaled down, the height of the conventional plug remains the same while the width of the conventional plug is continuously decreased. As a result, the aspect ratio of the conventional plug may be, for example, greater than 1:6, even greater than 1:8 which make fabrication of such conventional plug difficult.

To overcome such issue, the conventional plug may be split into two plugs, which fabricate separately, to avoid the high aspect ratio situation of the conventional plug, and a pad having width greater than that of the two plugs have to dispose between the two plugs to ensure the electrically connection of the two plugs. However, the greater width pad may be a limitation of the design rule when the dimensions of semiconductor devices are continuously being scaled down.

In contrast, in the embodiment depicted, the semiconductor device 1A employs the intervening conductive layers 301, which have about the same width comparing to the widths of the bottom conductive plugs 201 and the top conductive plugs 203, to electrically connect the bottom conductive plugs 201 and the top conductive plugs 203; therefore, the pattern density of the semiconductor device 1A may be increased. In addition, the non-planar top surfaces 301TS of the intervening conductive layers 301 may decrease the contact resistance between the top conductive plugs 203 and the intervening conductive layers 301 which can ensure the electrically connection thereof and can reduce the power consumption of the semiconductor device 1A.

FIGS. 2 to 8 illustrate, in a schematic cross-sectional view diagrams, semiconductor device 1B, 1C, 1D, 1E, 1F, 1G, and 1H in accordance with some embodiments of the present disclosure.

Figure 2:
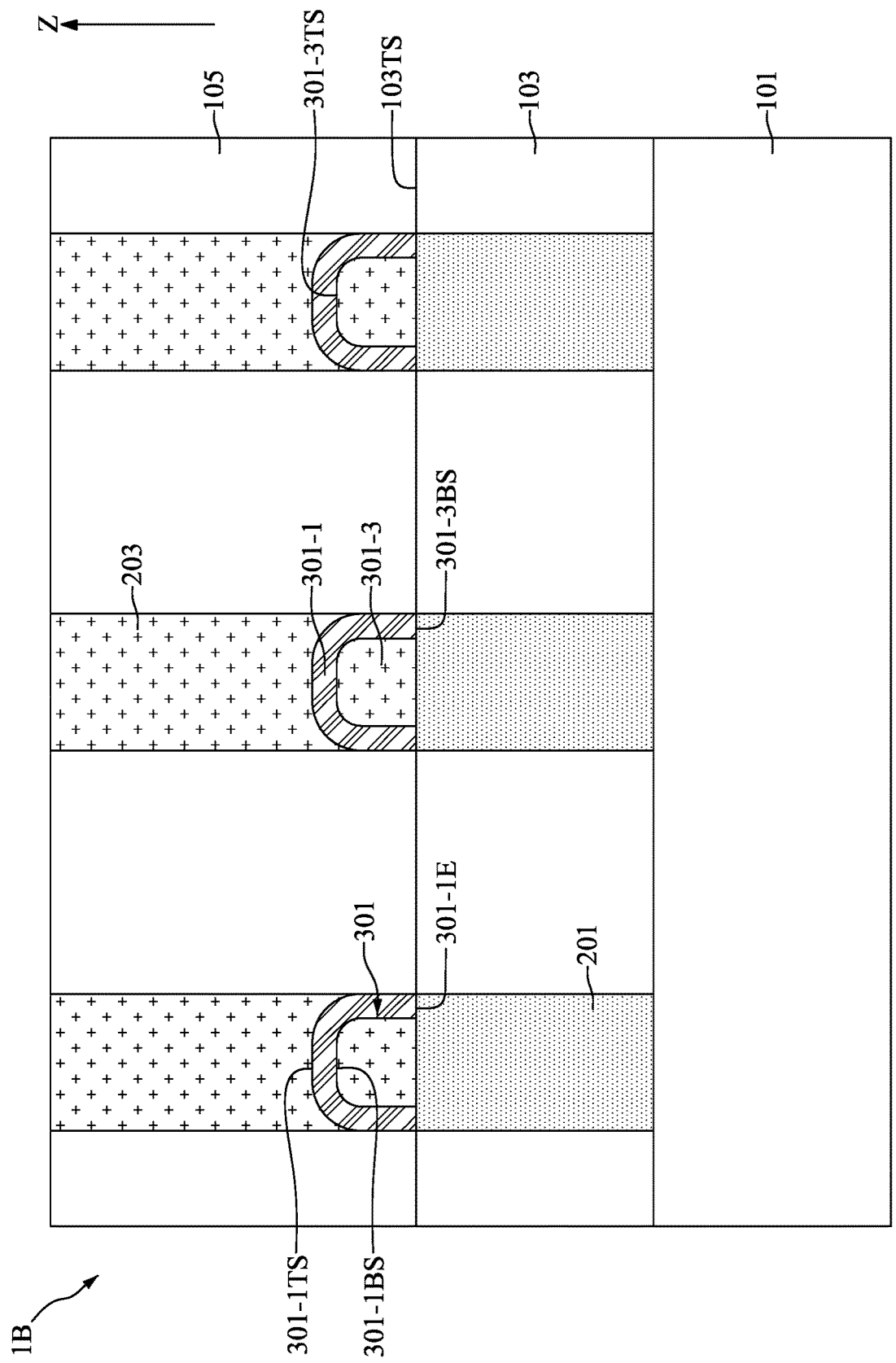
FIGS. 2 to 8 illustrate, in a schematic cross-sectional view diagrams, semiconductor device in accordance with some embodiments of the present disclosure.

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

With reference to FIG. 2, the intervening conductive layer 301 may include an outer portion 301-1 and a center portion 301-3. The center portion 301-3 may be disposed on the bottom conductive plug 201 and may have a semi-circular cross-sectional profile or a semi-oval cross-sectional profile. The outer portion 301-1 may be disposed covering the top surface 301-3TS of the center portion 301-3 and may have a circular arc cross-sectional profile. The top surface 301-1TS and the bottom surface 301-1BS of the outer portion 301-1 may be convex. The two ends 301-1E of the outer portion 301-1, the bottom surface 301-3BS of the center portion 301-3, and the top surface 103TS of the first insulating layer 103 may be substantially coplanar. The outer portion 301-1 may have an approximately uniform thickness. The top conductive plug 203 may be disposed on the top surface 301-1TS of the outer portion 301-1.

The outer portion 301-1 of the intervening conductive layer 301 may be formed of, for example, metal silicide. In some embodiments, the outer portion 301-1 of the intervening conductive layer 301 may include impurities such as phosphorus, arsenic, antimony, or boron. The center portion 301-3 of the intervening conductive layer 301 may be formed of, for example, polycrystalline silicon, polycrystalline germanium, polycrystalline silicon-germanium, or the like. In some embodiments, the center portion 301-3 of the intervening conductive layer 301 may include impurities such as phosphorus, arsenic, antimony, or boron.

Figure 3:
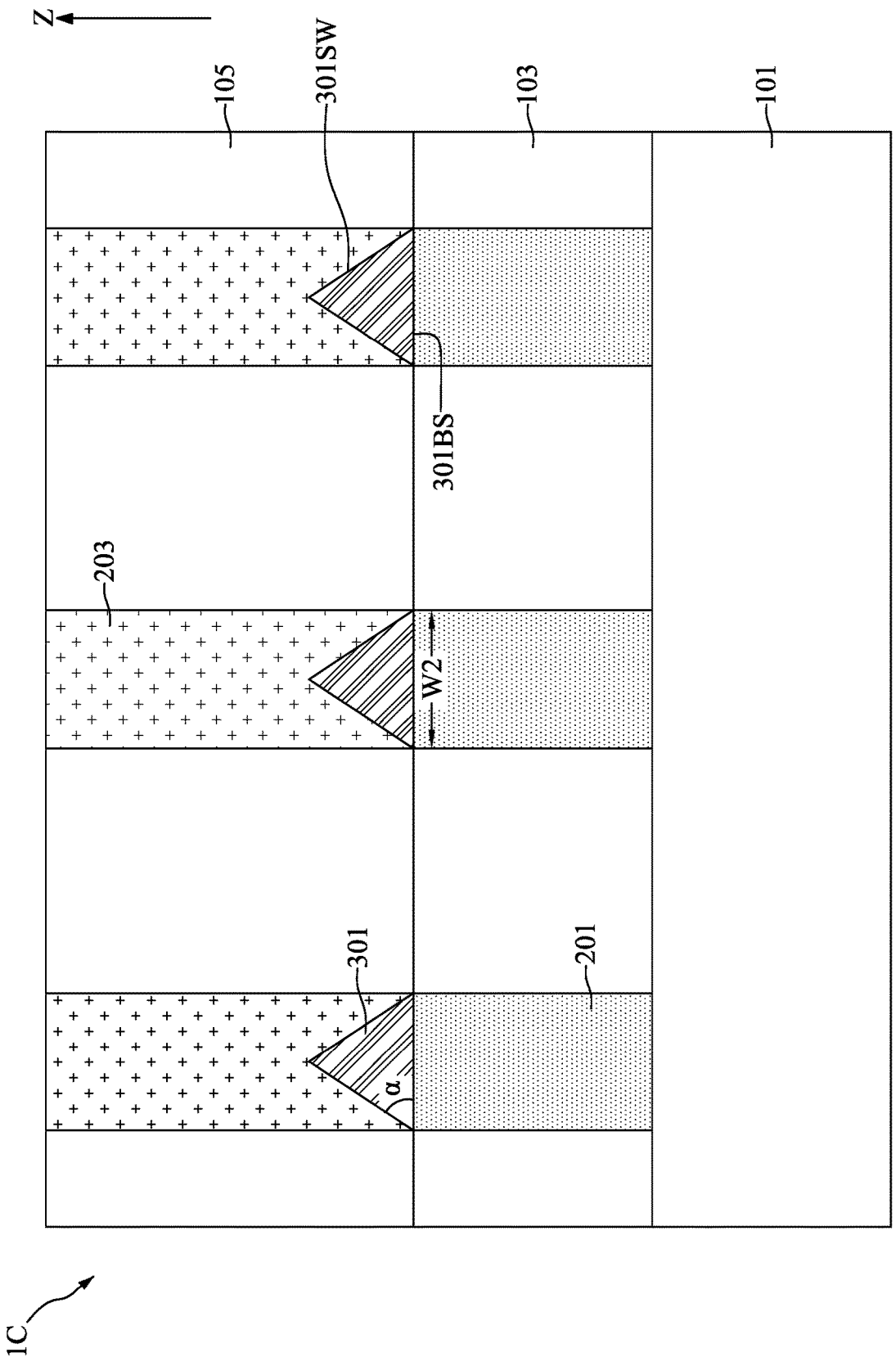

With reference to FIG. 3, the semiconductor device 1C may have a structure similar to that illustrated in FIG. 1. The same or similar elements in FIG. 3 as in FIG. 1 have been marked with similar reference numbers and duplicative descriptions have been omitted.

With reference to FIG. 3, the intervening conductive layer 301 may have a triangular cross-sectional profile. The sidewalls 301SW of the intervening conductive layer 301 may be tapered along the direction Z. The width W2 of the intervening conductive layer 301 may gradually decrease from bottom to top along the direction Z. The sidewalls 301SW of the intervening conductive layer 301 may have <111> crystal orientation. The angle α between the sidewalls 301SW of the intervening conductive layer 301 and the bottom surface 301BS of the intervening conductive layer 301 may be between about 60 degree and about 80 degree.

Figure 4:
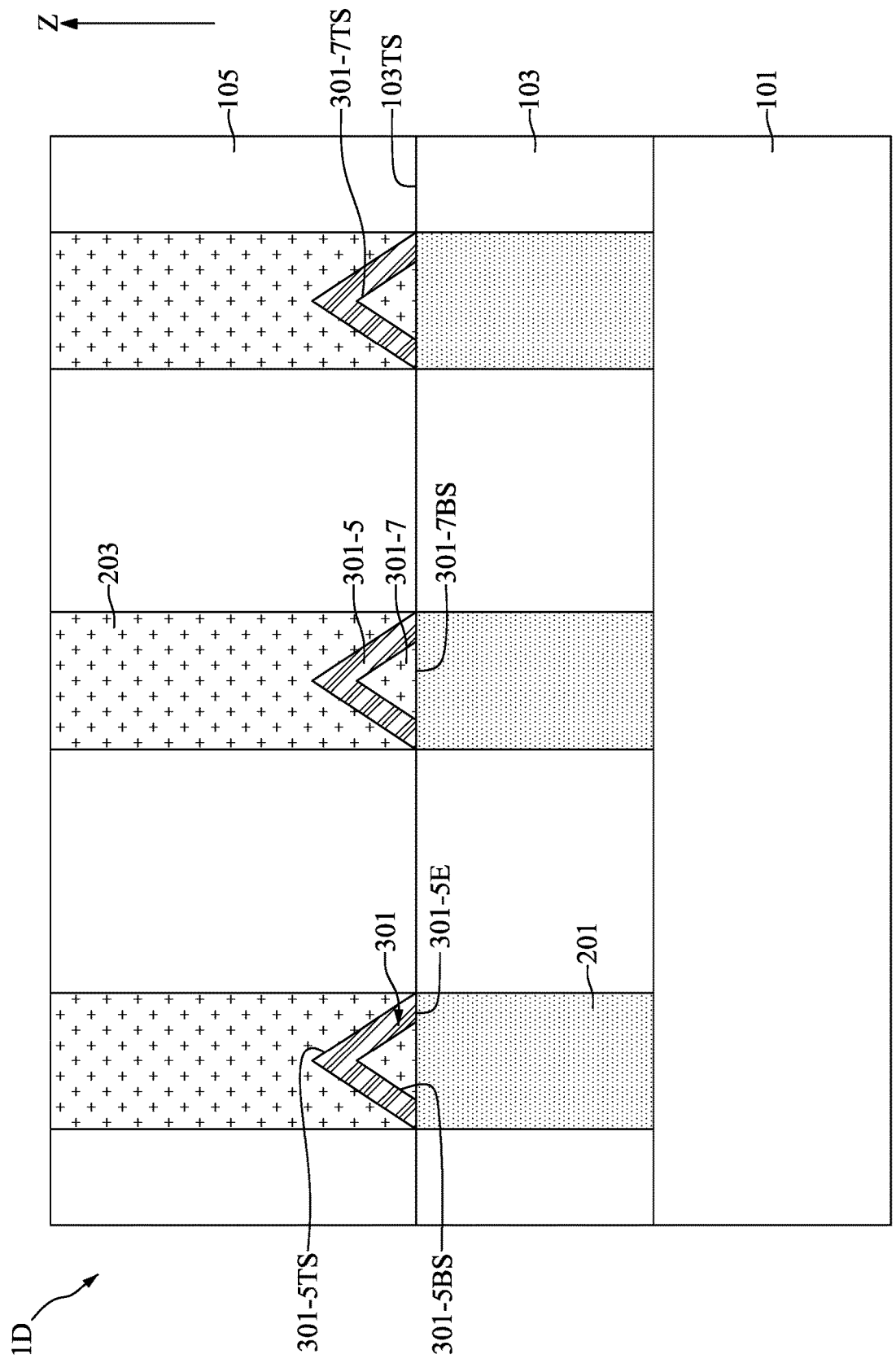

With reference to FIG. 4, the semiconductor device 1D may have a structure similar to that illustrated in FIG. 3. The same or similar elements in FIG. 4 as in FIG. 3 have been marked with similar reference numbers and duplicative descriptions have been omitted.

With reference to FIG. 4, the intervening conductive layer 301 may include an upper portion 301-5 and a lower portion 301-7. The lower portion 301-7 may be disposed on the bottom conductive plug 201 and may have a triangular cross-sectional profile. The upper portion 301-5 may be disposed covering the top surface 301-7TS of the lower portion 301-7 and may have an inverted V-shaped cross-sectional profile. The top surface 301-5TS and the bottom surface 301-5BS of the upper portion 301-5 may be an inverted V-shaped. The two ends 301-5E of the upper portion 301-5, the bottom surface 301-7BS of the lower portion 301-7, and the top surface 103TS of the first insulating layer 103 may be substantially coplanar. The upper portion 301-5 may have an approximately uniform thickness. The top conductive plug 203 may be disposed on the top surface 301-5TS of the upper portion 301-5.

The upper portion 301-5 of the intervening conductive layer 301 may be formed of, for example, metal silicide. In some embodiments, the upper portion 301-5 of the intervening conductive layer 301 may include impurities such as phosphorus, arsenic, antimony, or boron. The lower portion 301-7 of the intervening conductive layer 301 may be formed of, for example, polycrystalline silicon, polycrystalline germanium, polycrystalline silicon-germanium, or the like. In some embodiments, the lower portion 301-7 of the intervening conductive layer 301 may include impurities such as phosphorus, arsenic, antimony, or boron.

Figure 5:
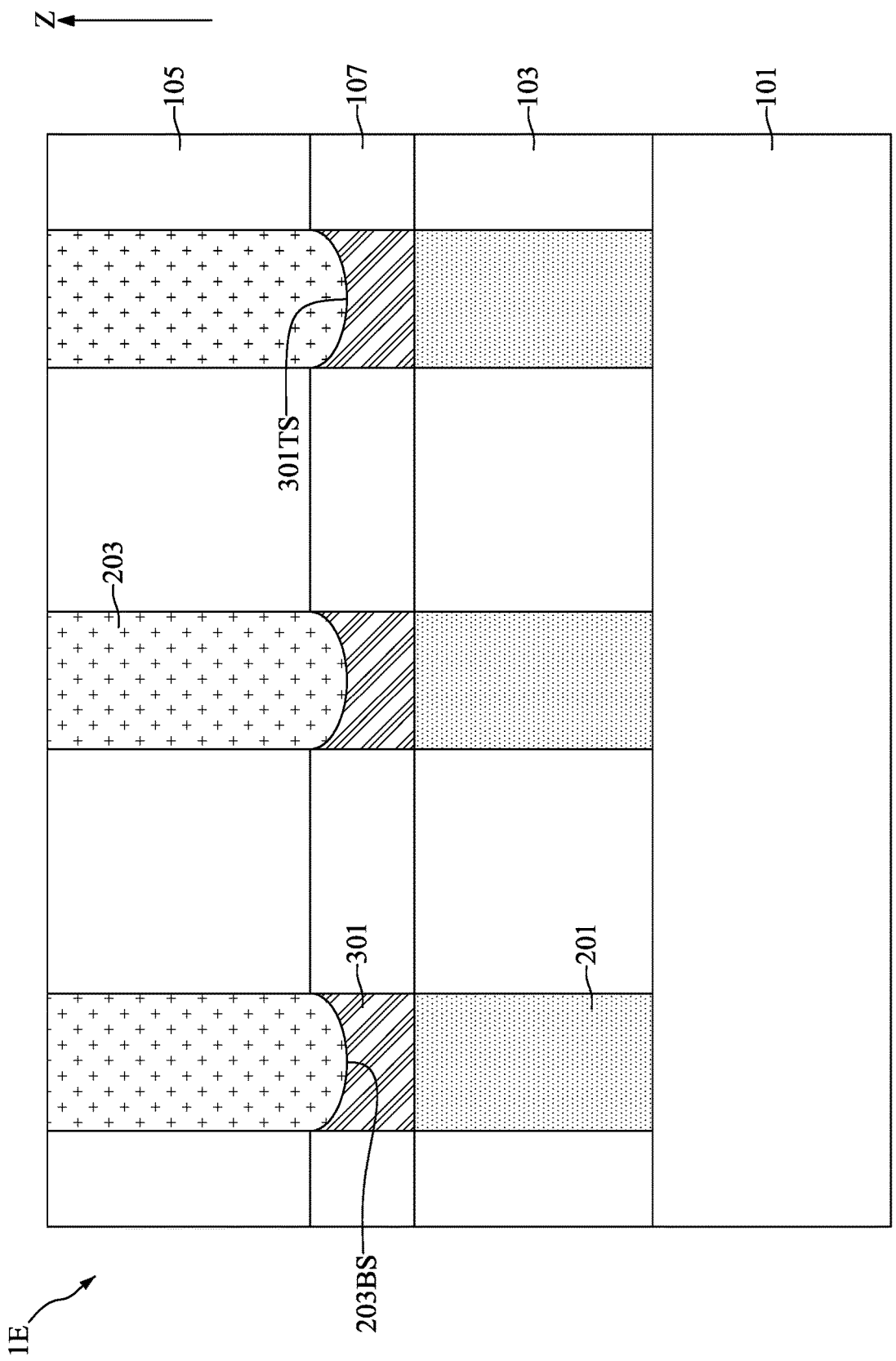

With reference to FIG. 5, the semiconductor device 1E may have a structure similar to that illustrated in FIG. 1. The same or similar elements in FIG. 5 as in FIG. 1 have been marked with similar reference numbers and duplicative descriptions have been omitted.

With reference to FIG. 5, a third insulating layer 107 may be disposed between the first insulating layer 103 and the second insulating layer 105. The third insulating layer 107 may be formed of a same material as the second insulating layer 105 but is not limited thereto. The intervening conductive layers 301 may be disposed in the third insulating layer 107. The top surface 301TS of the intervening conductive layer 301 may be concave. The bottom surface 203BS of the top conductive plug 203 may be convex.

Figure 6:
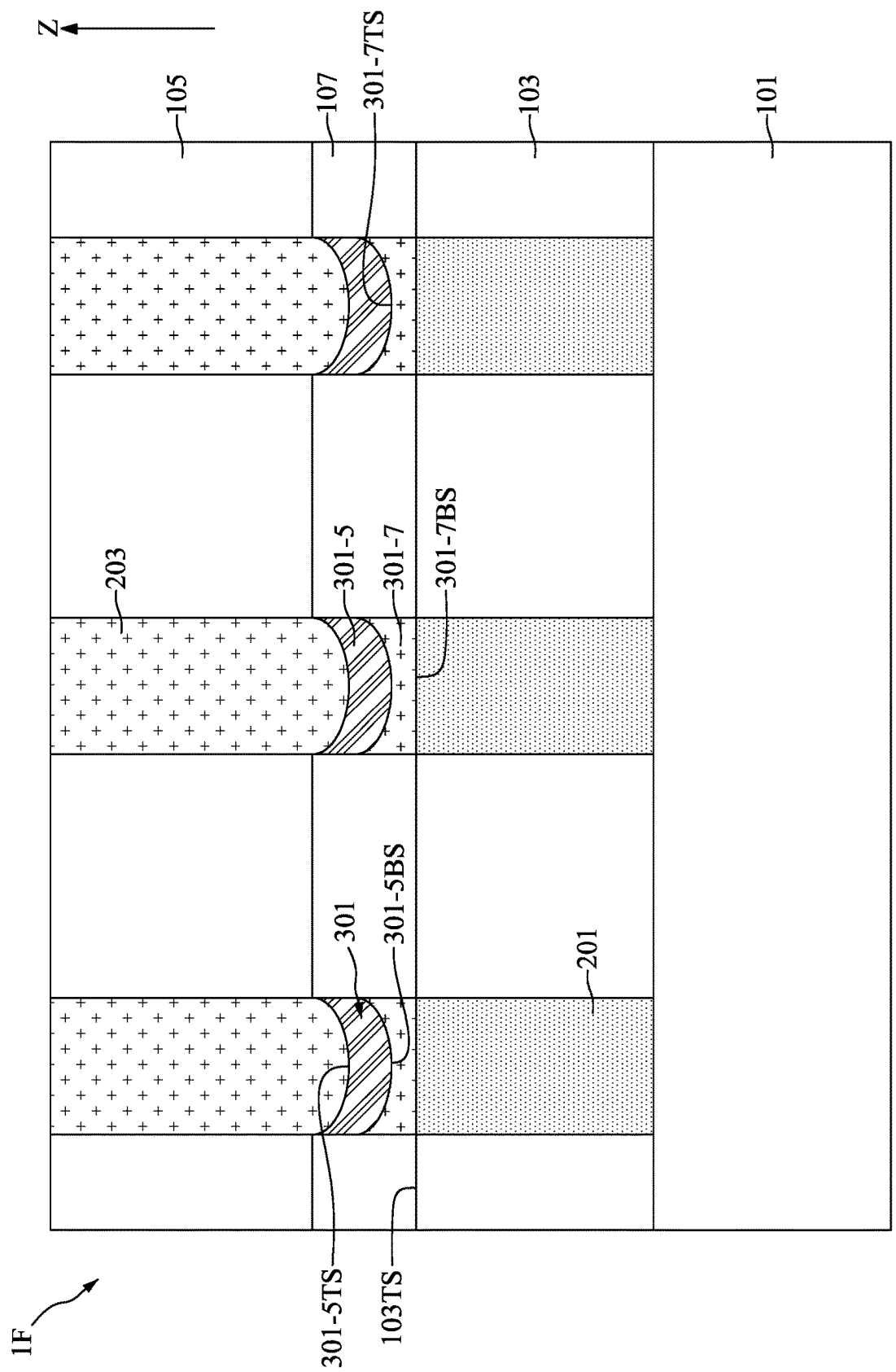

With reference to FIG. 6, the semiconductor device 1F may have a structure similar to that illustrated in FIG. 5. The same or similar elements in FIG. 6 as in FIG. 5 have been marked with similar reference numbers and duplicative descriptions have been omitted.

With reference to FIG. 6, the intervening conductive layer 301 may include an upper portion 301-5 and a lower portion 301-7. The lower portion 301-7 may be disposed on the bottom conductive plug 201. The top surface 301-7TS of the lower portion 301-7 may be concave. The upper portion 301-5 may be disposed on the top surface 301-7TS of the lower portion 301-7 and may have a circular arc cross-sectional profile. The top surface 301-5TS and the bottom surface 301-5BS of the upper portion 301-5 may be concave. The bottom surface 301-7BS of the lower portion 301-7 and the top surface 103TS of the first insulating layer 103 may be substantially coplanar. The upper portion 301-5 may have an approximately uniform thickness. The top conductive plug 203 may be disposed on the top surface 301-5TS of the upper portion 301-5.

The upper portion 301-5 of the intervening conductive layer 301 may be formed of, for example, metal silicide. In some embodiments, the upper portion 301-5 of the intervening conductive layer 301 may include impurities such as phosphorus, arsenic, antimony, or boron. The lower portion 301-7 of the intervening conductive layer 301 may be formed of, for example, polycrystalline silicon, polycrystalline germanium, polycrystalline silicon-germanium, or the like. In some embodiments, the lower portion 301-7 of the intervening conductive layer 301 may include impurities such as phosphorus, arsenic, antimony, or boron.

Figure 7:
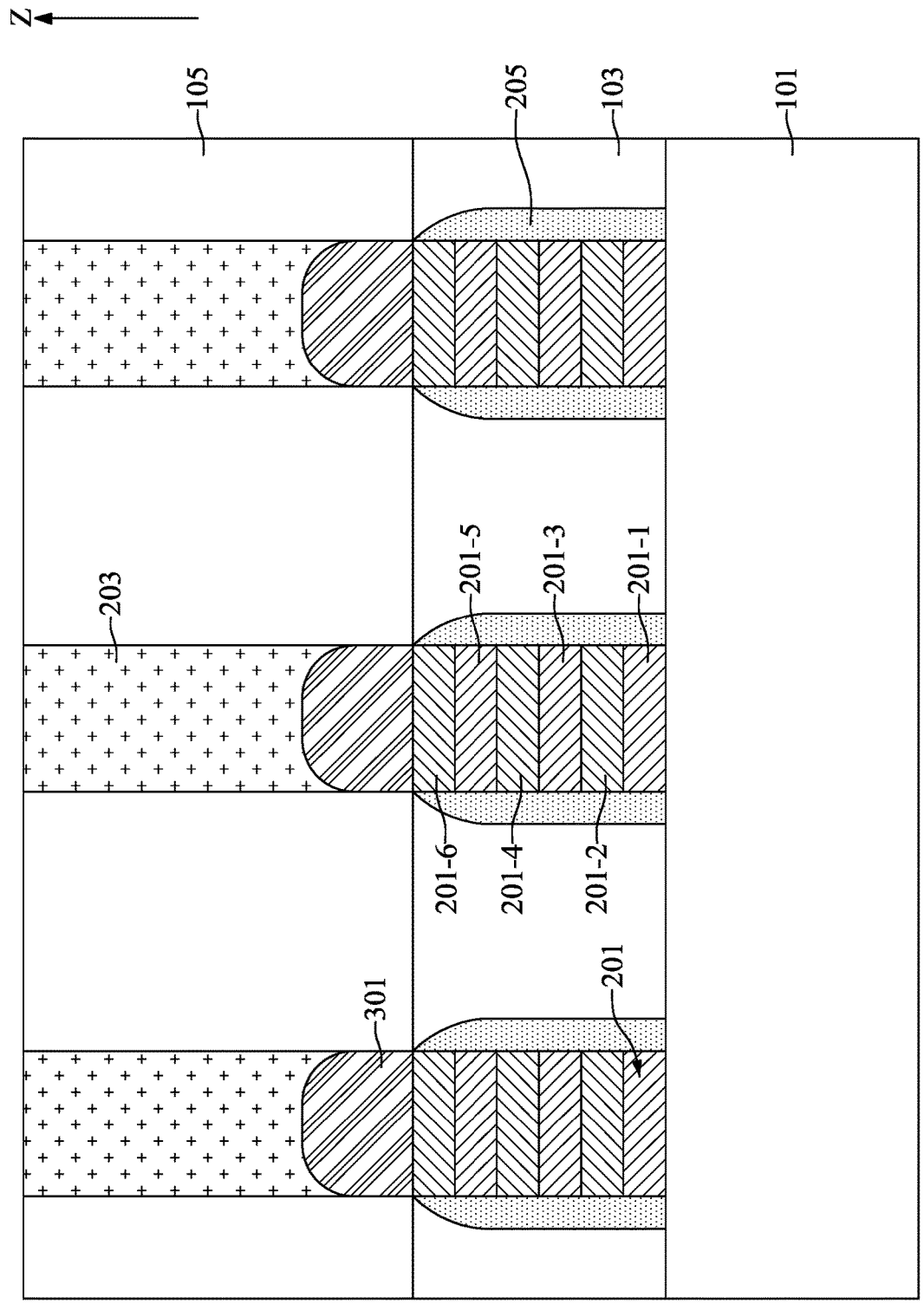

With reference to FIG. 7, the semiconductor device 1G may have a structure similar to that illustrated in FIG. 1. The same or similar elements in FIG. 7 as in FIG. 1 have been marked with similar reference numbers and duplicative descriptions have been omitted.

With reference to FIG. 7, the bottom conductive plug 201 may include a plurality of first conductive layers 201-1, 201-3, 201-5 and a plurality of second conductive layers 201-2, 201-4, 201-6. The plurality of first conductive layers 201-1, 201-3, 201-5 and the plurality of second conductive layers 201-2, 201-4, 201-6 may be alternatively stacked.

In some embodiments, the plurality of first conductive layers 201-1, 201-3, 201-5 and the plurality of second conductive layers 201-2, 201-4, 201-6 may have different stress states. For example, the plurality of first conductive layers 201-1, 201-3, 201-5 may have tensile stress and the plurality of second conductive layers 201-2, 201-4, 201-6 may have compressive stress, or vice versa. The plurality of first conductive layers 201-1, 201-3, 201-5 and the plurality of second conductive layers 201-2, 201-4, 201-6 may be formed including, for example, titanium, titanium nitride, ruthenium, molybdenum, chromium, vanadium, palladium, platinum, rhodium, scandium, aluminum, niobium, niobium nitride, tungsten, tungsten nitride, tantalum, tantalum nitride, or silicides thereof.

The stress states of the plurality of first conductive layers 201-1, 201-3, 201-5 and the plurality of second conductive layers 201-2, 201-4, 201-6 may be controlled by forming the plurality of first conductive layers 201-1, 201-3, 201-5 and the plurality of second conductive layers 201-2, 201-4, 201-6 with different materials. Specifically, the plurality of first conductive layers 201-1, 201-3, 201-5 are formed of a material having a higher stress state and the plurality of second conductive layers 201-2, 201-4, 201-6 are formed a material having a lower stress state. The plurality of second conductive layers 201-2, 201-4, 201-6 having lower stress state may have thicker thicknesses than the plurality of first conductive layers 201-1, 201-3, 201-5 having higher stress state to compensate for the stress of the plurality of first conductive layers 201-1, 201-3, 201-5 having higher stress state. Specifically, the plurality of first conductive layers 201-1, 201-3, 201-5 may have thicknesses between about 5 nm and 50 nm. The plurality of second conductive layers 201-2, 201-4, 201-6 may have thicknesses between about 10 nm and about 150 nm.

In some embodiments, the plurality of first conductive layers 201-1, 201-3, 201-5 may be large grain layers and the plurality of plurality of second conductive layers 201-2, 201-4, 201-6 may be buffer layers. The large grain layers and the buffer layers may be formed including, for example, titanium, titanium nitride, ruthenium, molybdenum, chromium, vanadium, palladium, platinum, rhodium, scandium, aluminum, niobium, niobium nitride, tungsten, tungsten nitride, tantalum, tantalum nitride, tantalum oxide, or silicides thereof. For example, the large grain layers may be formed of a pure metal (e.g., tantalum) and the buffer layers may be formed of the metal nitride (e.g., tantalum nitride) or metal oxide (e.g., tantalum oxide) versions of the pure metal. The large grain layers may have thicknesses between about 10 nm and about 30 nm. The buffer layers may have thicknesses between about 1 nm and about 5 nm. The buffer layers may block crystal structures of underlying large grain layers from extending upward in the direction Z to prevent the propagation of grain structure through the bottom conductive plug 201. As a result, the stress of the bottom conductive plug 201 may be reduced and the wafer bowing may be reduced or avoided.

With reference to FIG. 7, the spacers 205 may be disposed on the sidewalls of the bottom conductive plug 201. The spacers 205 may be formed of, for example, silicon oxide, silicon nitride, silicon carbon nitride, silicon nitride oxide, or silicon oxynitride. The spacers 205 may electrically isolate the bottom conductive plug 201 from neighboring conductive elements disposed adjacent to two sides of the bottom conductive plug 201. In some embodiments, the spacers 205 may be optional.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 8:
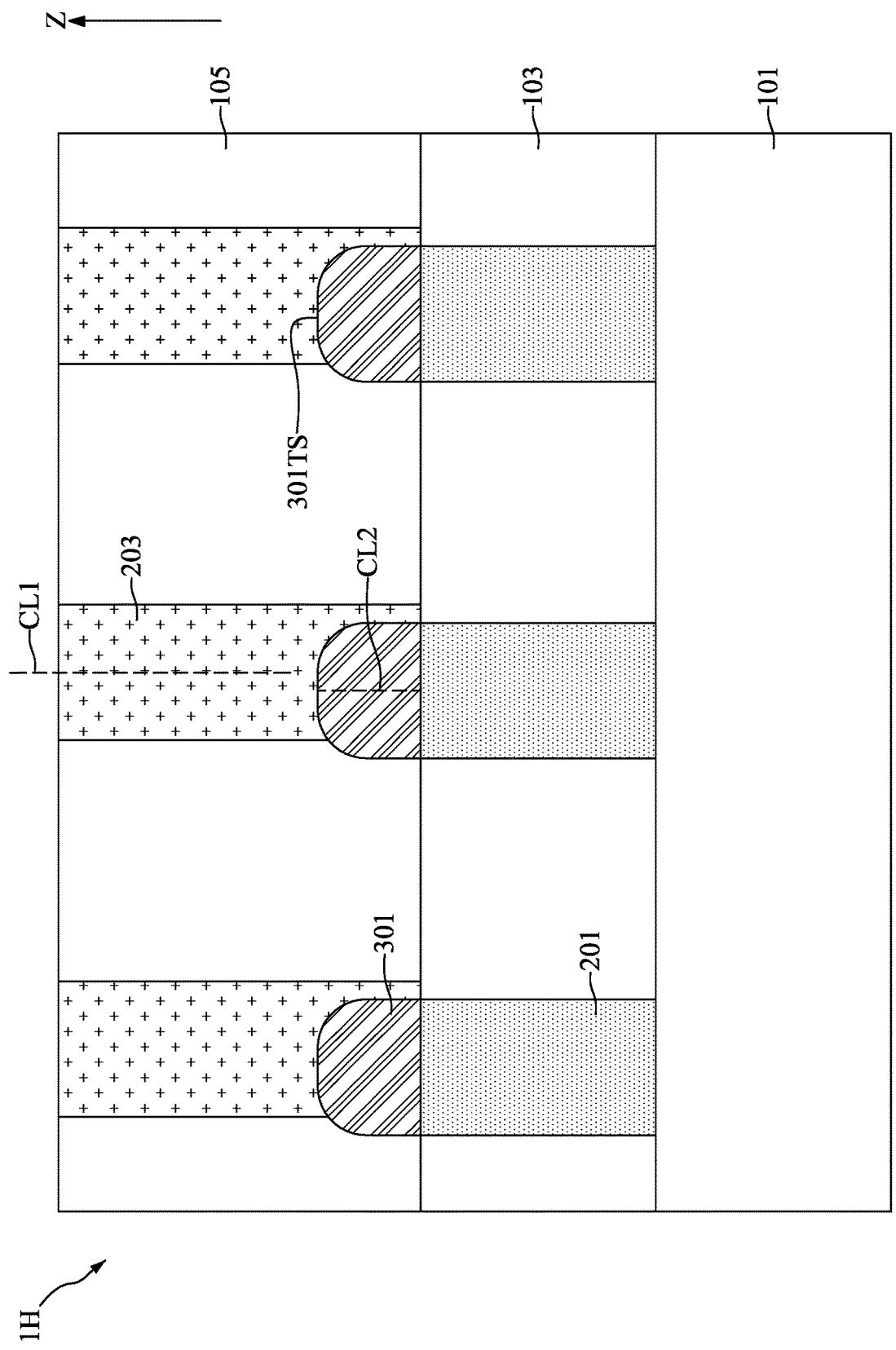

With reference to FIG. 8, the semiconductor device 1H may have a structure similar to that illustrated in FIG. 1. The same or similar elements in FIG. 8 as in FIG. 1 have been marked with similar reference numbers and duplicative descriptions have been omitted.

With reference to FIG. 8, the central line CL1 of the top conductive plug 203 may be offset from the central line CL2 of the intervening conductive layer 301. In other words, the top conductive plug 203 may be asymmetrically disposed on the intervening conductive layer 301. The non-planar top surface 301TS of the intervening conductive layer 301 may increase the contact surface between the top conductive plugs 203 and the intervening conductive layers 301.

As the contact resistance between the top conductive plugs 203 and the intervening conductive layers 301 is inversely proportional to the contact surface between the top conductive plugs 203 and the intervening conductive layers 301. Even the top conductive plug 203 may be asymmetrically disposed on the intervening conductive layer 301, the non-planar top surface 301TS of the intervening conductive layer 301 can still provide solid electrically connection between the top conductive plugs 203 and the intervening conductive layers 301 due to low contact resistance originating from the non-planar top surface 301TS of the intervening conductive layer 301. In other words, the non-planar top surface 301TS of the intervening conductive layer 301 may enlarge the tolerance window for the photolithography process during the fabrication of the top conductive plugs 203. As a result, the yield of fabrication of the semiconductor device 1H may be increased.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 9:
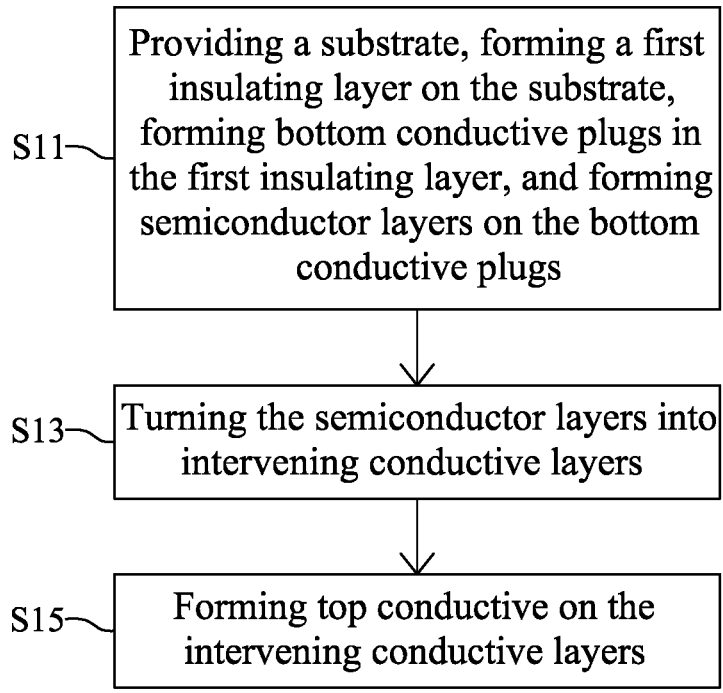
FIG. 9 illustrates, in a flowchart diagram form, a method for fabricating a semiconductor device in accordance with one embodiment of the present disclosure.
Figure 16:
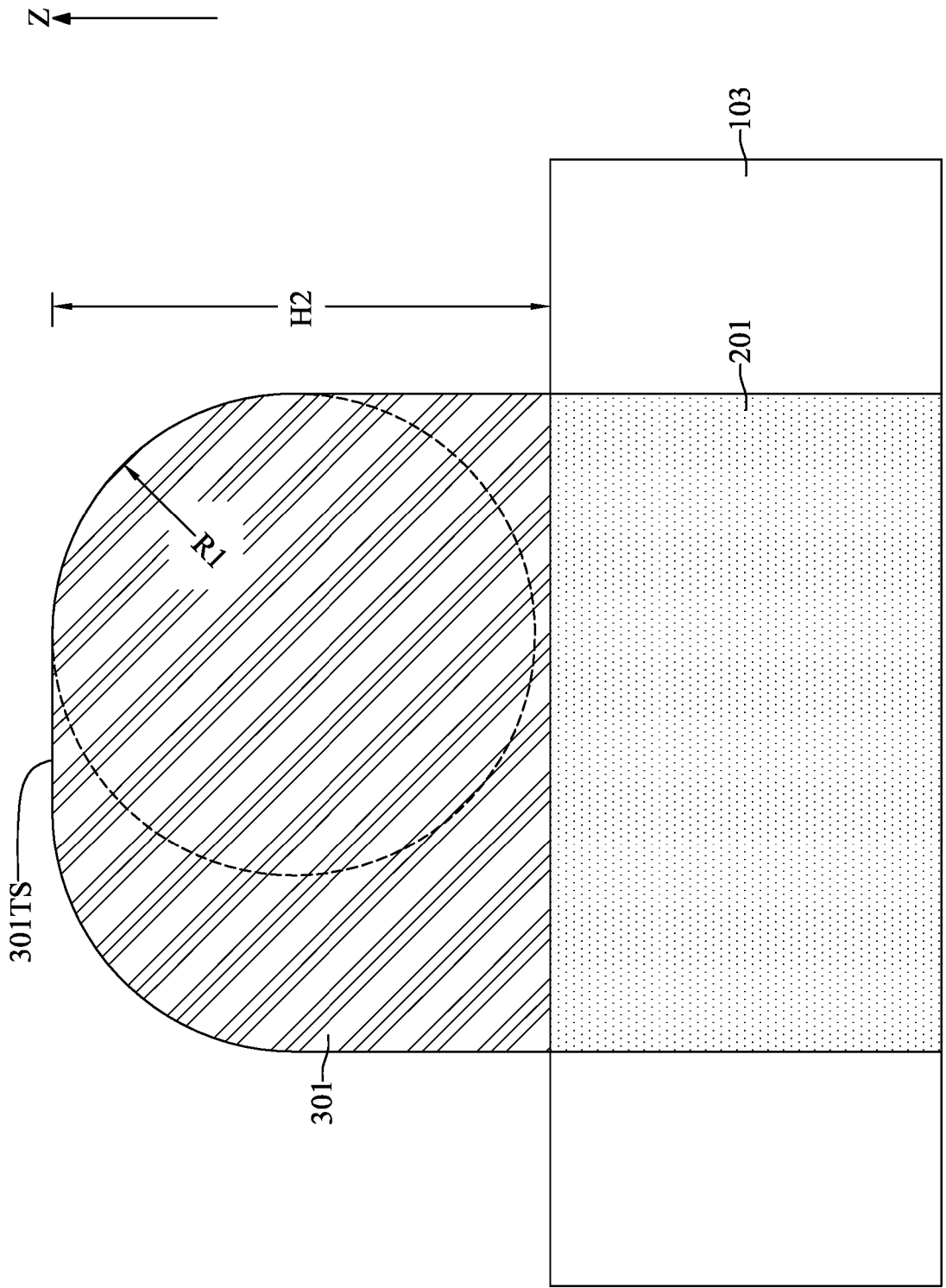
FIG. 16 is a close-up diagram of FIG. 15.
Figure 17:
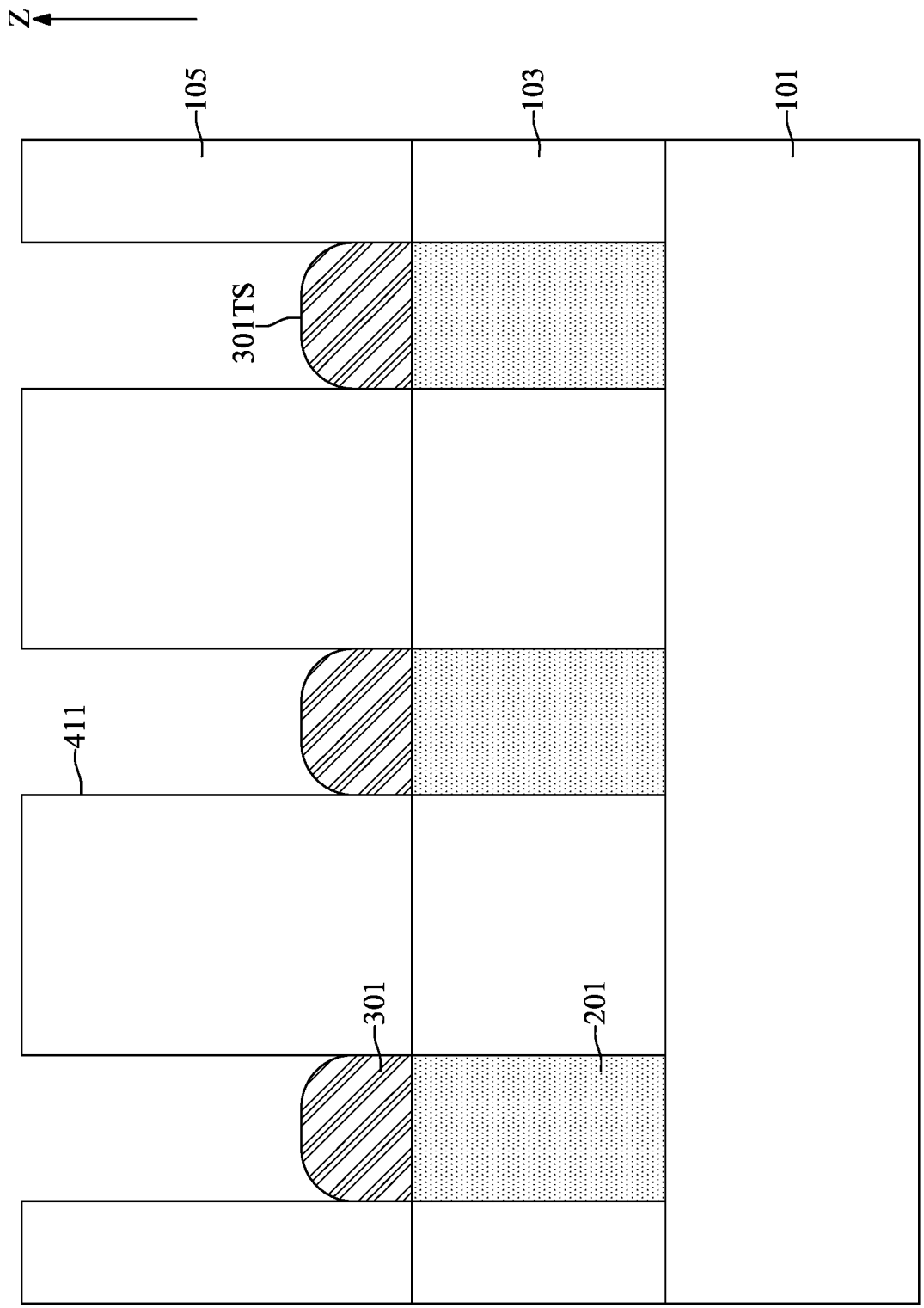
FIGS. 17 and 18 illustrate, in schematic cross-sectional view diagrams, part of the flow for fabricating the semiconductor device in accordance with one embodiment of the present disclosure.
Figure 18:
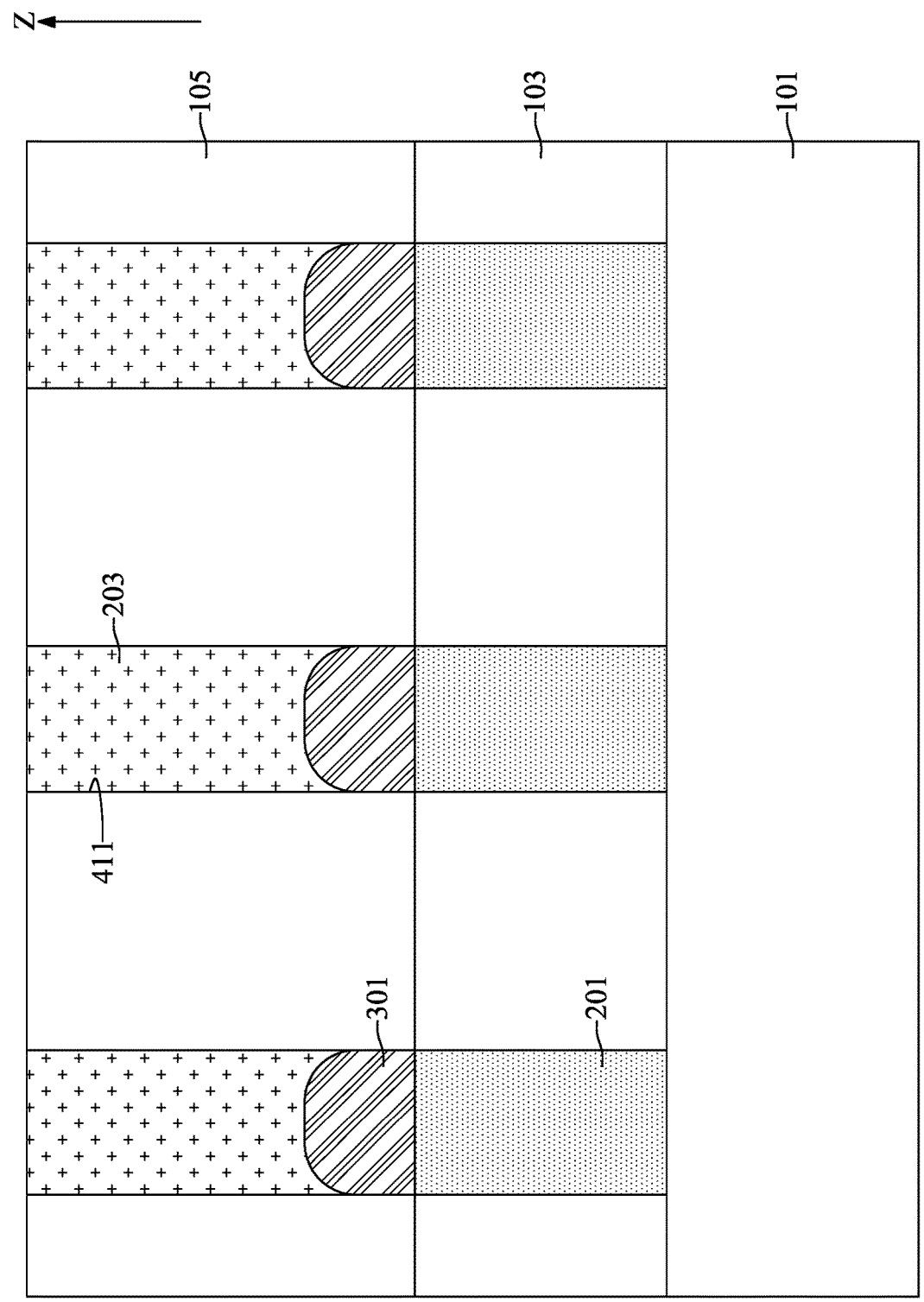

FIG. 9 illustrates, in a flowchart diagram form, a method 10 for fabricating a semiconductor device 1A in accordance with one embodiment of the present disclosure. FIGS. 10 to 15 illustrate, in schematic cross-sectional view diagrams, part of a flow for fabricating the semiconductor device 1A in accordance with one embodiment of the present disclosure. FIG. 16 is a close-up diagram of FIG. 15. FIGS. 17 and 18 illustrate, in schematic cross-sectional view diagrams, part of the flow for fabricating the semiconductor device 1A in accordance with one embodiment of the present disclosure.

With reference to FIGS. 9 to 13, at step S11, a substrate 101 may be provided, a first insulating layer 103 may be formed on the substrate 101, bottom conductive plugs 201 may be formed in the first insulating layer 103, and semiconductor layers 407 may be formed on the bottom conductive plugs 201.

Figure 10:
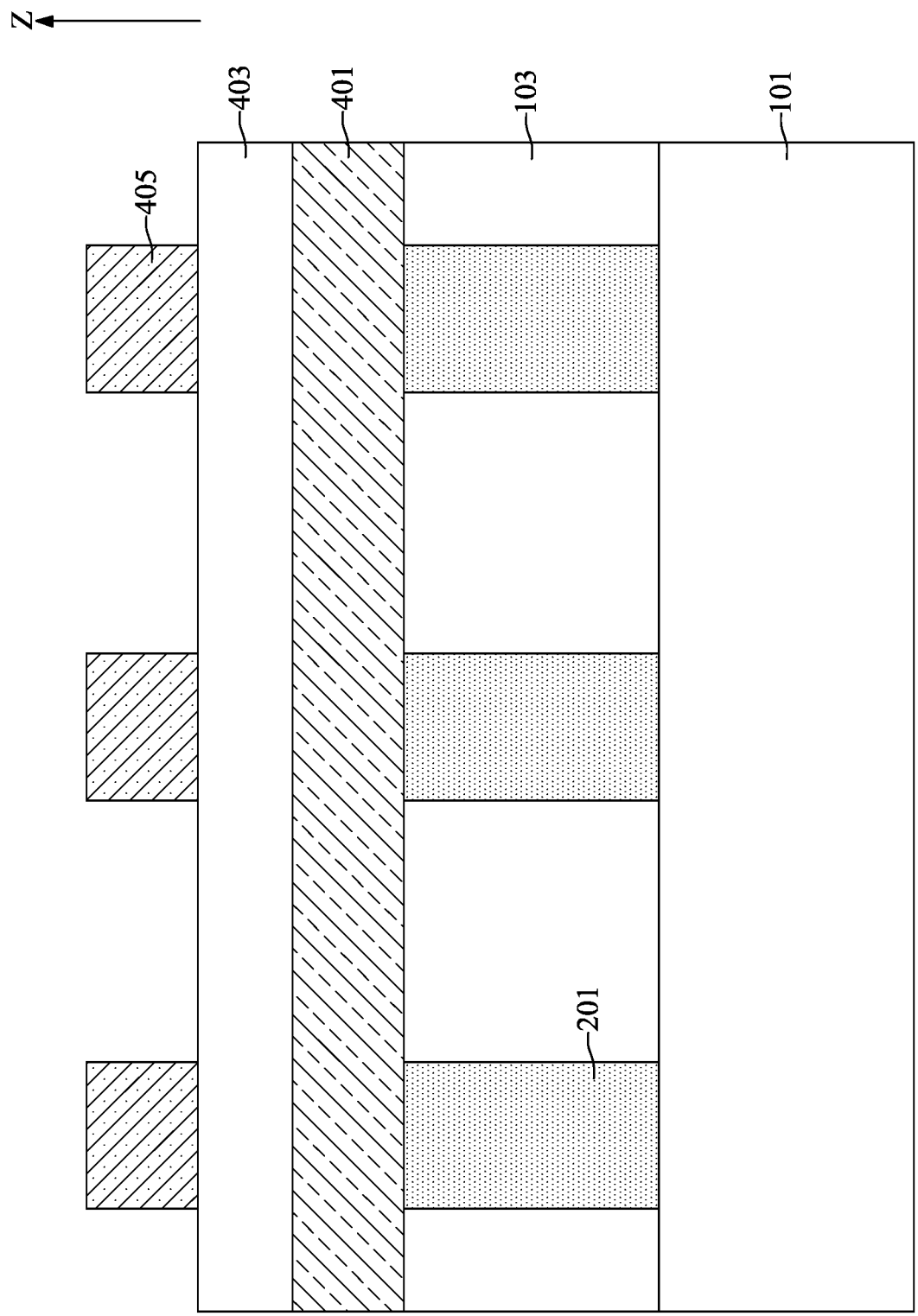
FIGS. 10 to 15 illustrate, in schematic cross-sectional view diagrams, part of a flow for fabricating the semiconductor device in accordance with one embodiment of the present disclosure.

With reference to FIG. 10, the first insulating layer 103 may be formed on the substrate 101 by a deposition process such as chemical vapor deposition, plasma enhanced chemical vapor deposition, low pressure chemical vapor deposition, or the like. The bottom conductive plugs 201 may be formed in the first insulating layer 103 by a damascene process.

With reference to FIG. 10, a layer of semiconductor material 401 may be formed on the first insulating layer 103. A first hard mask layer 403 may be formed on the layer of semiconductor material 401. The semiconductor material 401 may be, for example, polycrystalline silicon, polycrystalline germanium, polycrystalline silicon-germanium, or the like. In some embodiments, the layer of semiconductor material 401 may be doped with impurities such as phosphorus, arsenic, antimony, or boron. The first hard mask layer 403 may be formed of, for example, silicon oxide, silicon nitride, silicon oxynitride, silicon nitride oxide, the like, or a combination thereof. The layer of semiconductor material 401 and the first hard mask layer 403 may be formed by deposition processes such as chemical vapor deposition, plasma enhanced chemical vapor deposition, low pressure chemical vapor deposition, or the like.

With reference to FIG. 10, the first mask layer 405 may be formed on the first hard mask layer 403. The first mask layer 405 may be a photoresist layer. The first mask layer 405 may be patterned to define the pattern of the semiconductor layers 407.

Figure 11:
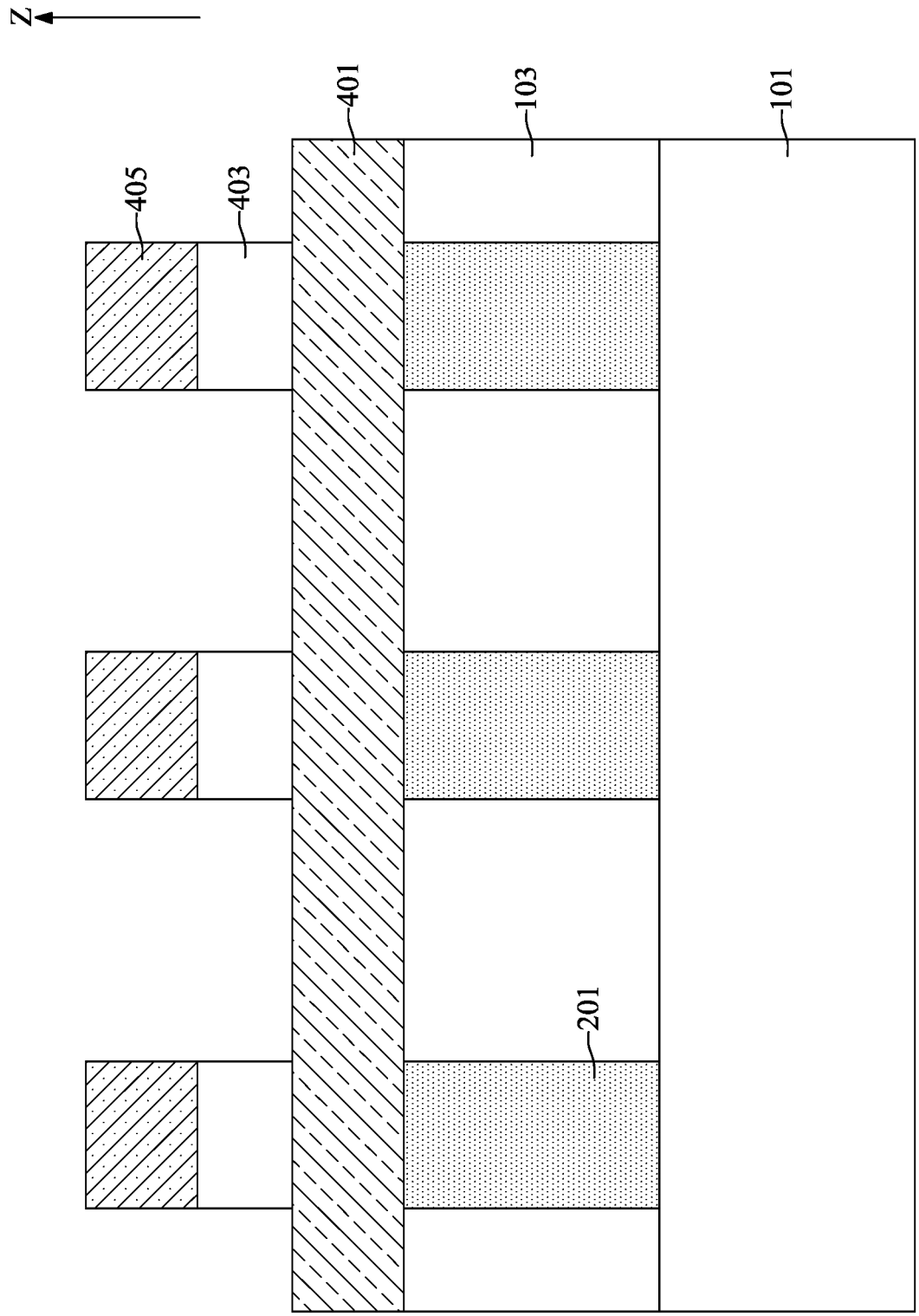

With reference to FIG. 11, a hard mask etch process may be performed to remove portions of the first hard mask layer 403 and transfer the pattern of the first mask layer 405 onto the first hard mask layer 403. The etch rate of the first mask layer 405 of the hard mask etch process may be faster than the etch rate of the layer of semiconductor material 401 of the hard mask etch process. For example, an etch rate ratio of the first mask layer 405 to the layer of semiconductor material 401 may be between about 100:1 and about 1.05:1 during the hard mask etch process. For another example, the etch rate ratio of the first mask layer 405 to the layer of semiconductor material 401 may be between about 100:1 and about 10:1 during the hard mask etch process. After the hard mask etch process, the first mask layer 405 may be removed.

Figure 12:
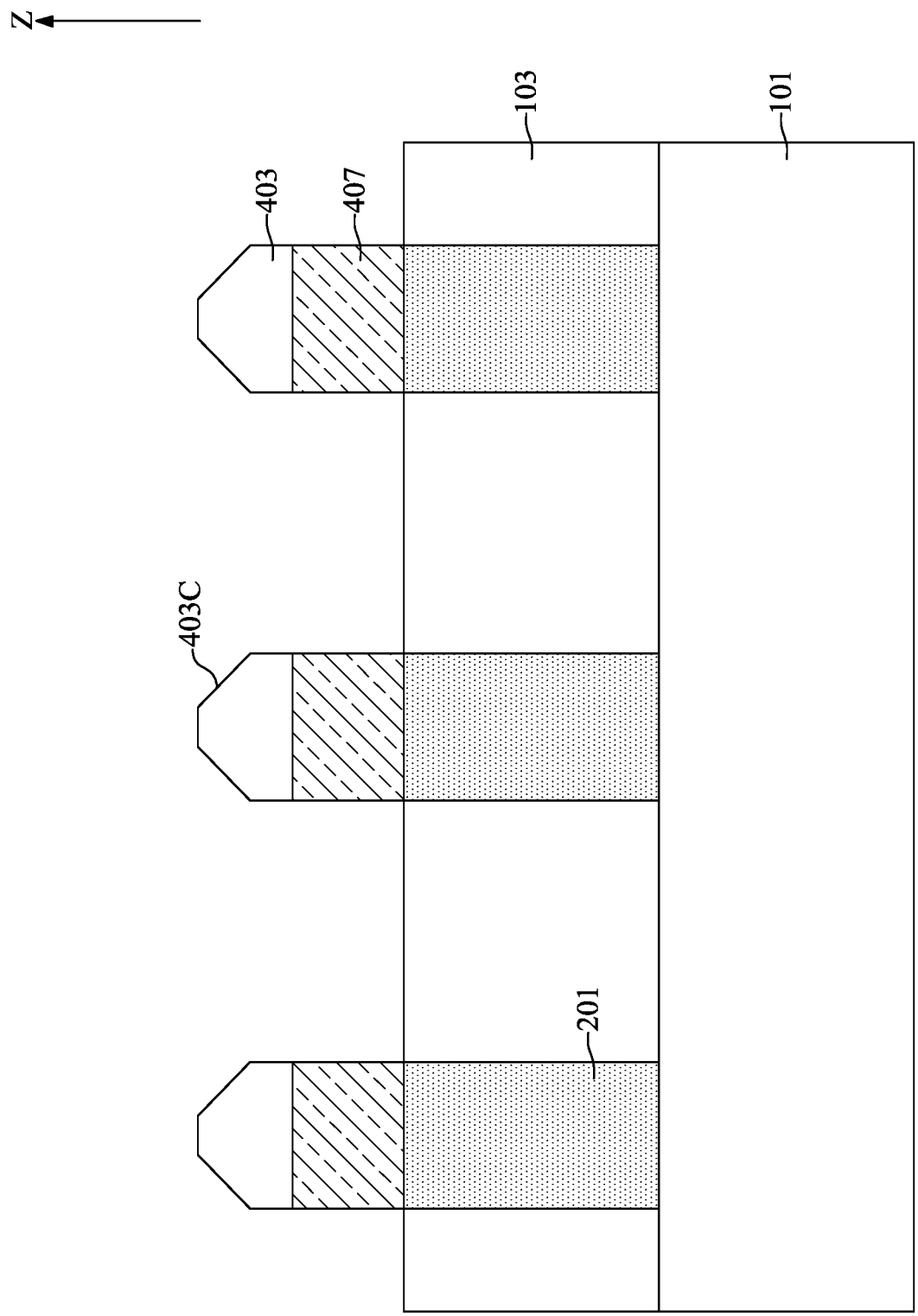

With reference to FIG. 12, a main etch process may be performed to remove portions of the layer of semiconductor material 401 and turn the layer of semiconductor material 401 into the semiconductor layers 407. A pressure of the main etch process may be between about 2 mTorr and about 10 mTorr. A source power of the main etch process may be between about 300 W and about 450 W. A bias power of the main etch process may be between about 20 W and about 150 W. In some embodiments, the main etch process may performed with gasses such as oxygen, chlorine, fluorocarbon, and hydrogen bromide. The etch rate of the layer of semiconductor material 401 of the main etch process may be faster than the etch rate of the first insulating layer 103 of the main etch process. For example, an etch rate ratio of the layer of semiconductor material 401 to the first insulating layer 103 may be between about 100:1 and about 1.05:1 during the main etch process. For another example, the etch rate ratio of the layer of semiconductor material 401 to the first insulating layer 103 may be between about 100:1 and about 10:1 during the main etch process.

During the main etch process, the first hard mask layer 403 may be gradually etched, and the ends of the top surface of the first hard mask layer 403 may be chamfered by collision with etching species. The ends of the top surface of the first hard mask layer 403 may be referred to as chamfered edges 403C hereinafter. Each of the chamfered edges 403C of the first hard mask layer 403 may have taper angle about 45 degree. The main etch process may be, for example, an anisotropic etch process.

Figure 13:
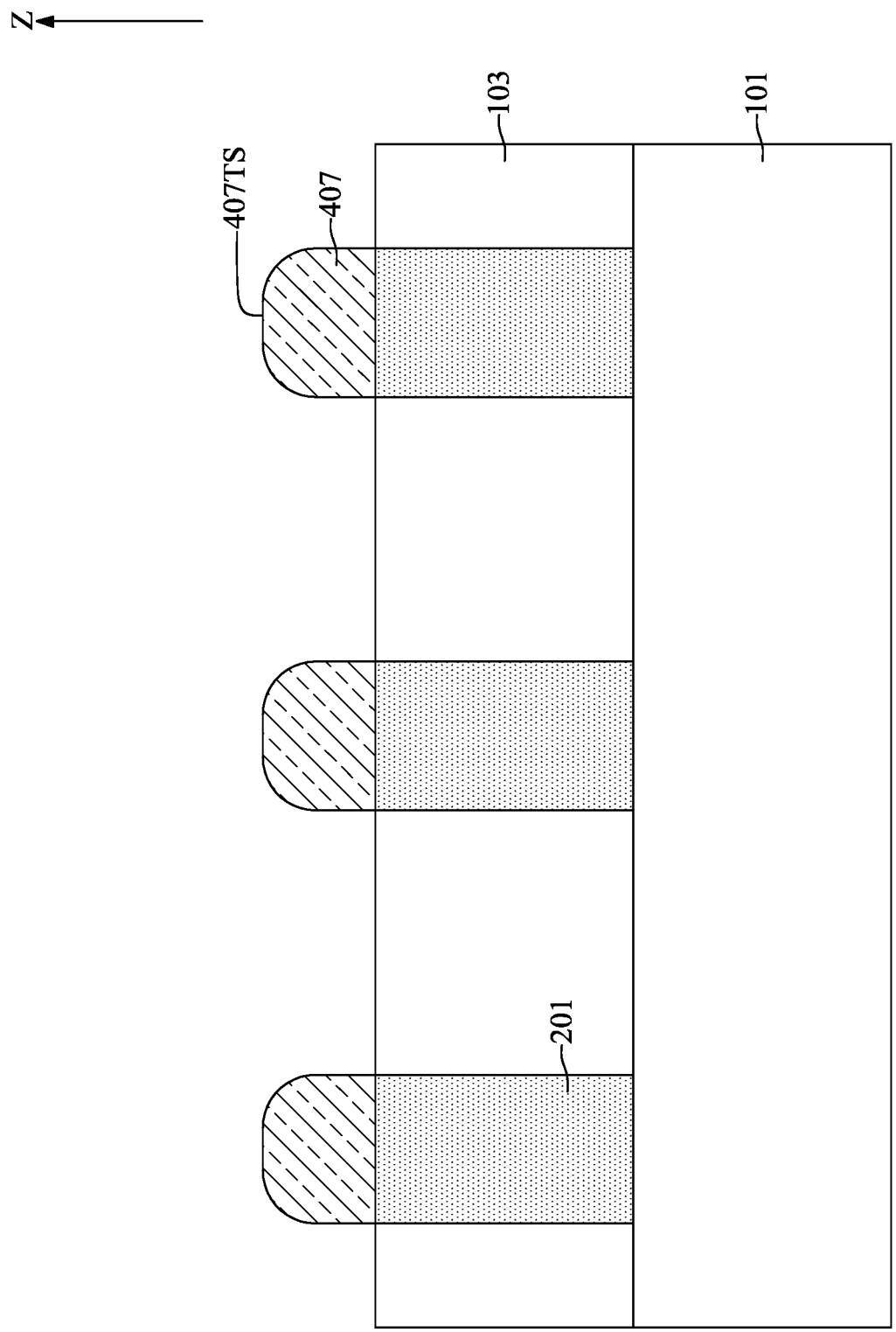

With reference to FIG. 13, an over etch process may be performed. A pressure of the over etch process may be between about 5 Pa and about 20 Pa. A power of the over etch process may be between about 100 W and about 200 W. In some embodiments, the over etch process may performed with gasses such as oxygen and fluoroform. Due to the edge corners of the top surfaces 407TS of the semiconductor layers 407 may be etched faster than flat center portions of the top surfaces 407TS of the semiconductor layers 407 and the semiconductor layers 407 may be etched according to the shape of the chamfered edge 403C of the first hard mask layer 403, the top surfaces 407TS of the semiconductor layers 407 may be rounded by the over etch process. The over etch process may be, for example, an anisotropic etch process.

With reference to FIG. 9 and FIGS. 14 to 16, at step S13, the semiconductor layers 407 may be turned into intervening conductive layers 301.

Figure 14:
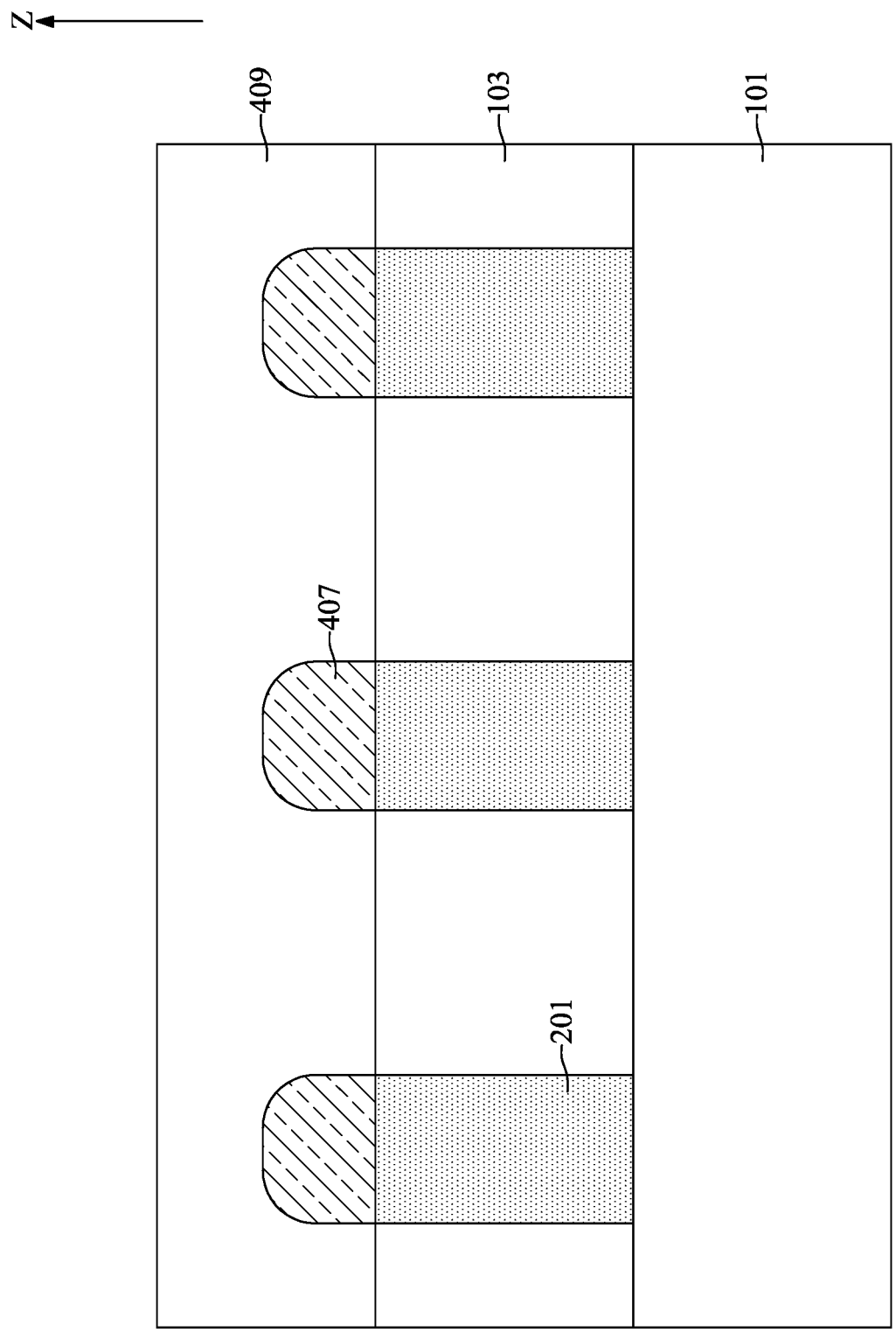

With reference to FIG. 14, a layer of conductive material 409 may be formed over the intermediate semiconductor device illustrated in FIG. 13. The layer of conductive material 409 may include, for example, titanium, nickel, platinum, tantalum, or cobalt.

Figure 15:
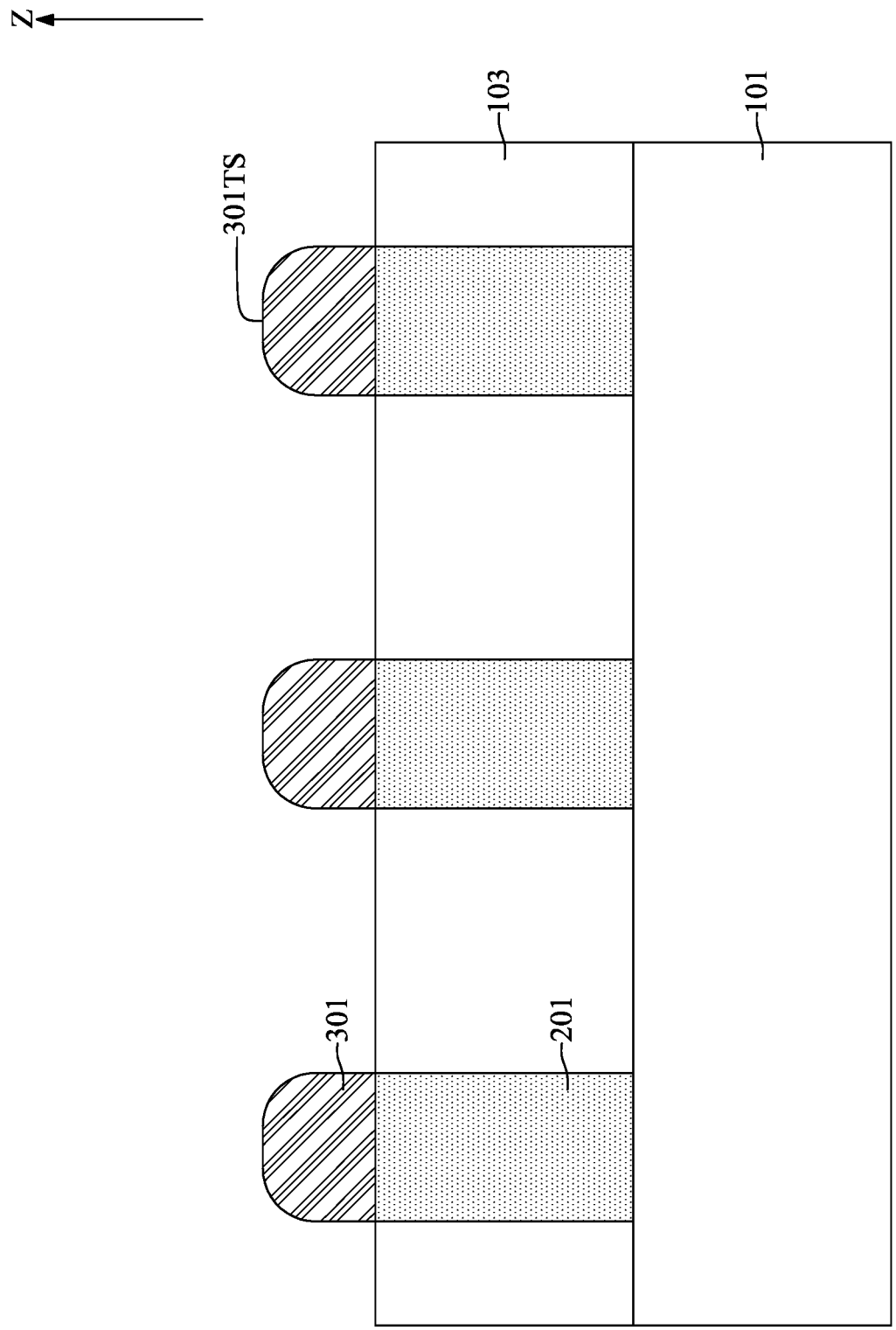

With reference to FIG. 15, a thermal treatment may be performed. During the thermal treatment, metal atoms of the layer of conductive material 409 may react chemically with silicon atoms of the semiconductor layers 407 to form the intervening conductive layers 301. The intervening conductive layers 301 may include metal silicide such as titanium silicide, nickel silicide, nickel platinum silicide, tantalum silicide, or cobalt silicide. The thermal treatment may be a dynamic surface annealing process. After the thermal treatment, a cleaning process may be performed to remove the unreacted conductive material 409. The cleaning process may use etchant such as hydrogen peroxide and an SC-1 solution. The shape of the intervening conductive layers 301 may inherited from the semiconductor layers 407. That is, the intervening conductive layers 301 may have rounded top surface 301TS.

With reference to FIG. 16, for each of the intervening conductive layers 301, a ratio of the radius of curvature R1 of the top surface 301TS of the intervening conductive layer 301 to the height H2 of the intervening conductive layer 301 may be between about 1:1 and about 1:4.

In some embodiments, only the portions of the semiconductor layers 407 exposed to the layer of conductive material 409 may be turned into metal silicide.

With reference to FIGS. 9, 17, and 18, at step S15, top conductive plugs 203 may be formed on the intervening conductive layers 301.

With reference to FIG. 17, a second insulating layer 105 may be formed to cover the intervening conductive layers 301. A planarization process, such as chemical mechanical polishing, may be performed to provide a substantially flat surface for subsequent processing steps. Subsequently, plug openings 411 may be formed along the second insulating layer 105 by a photolithography-etch process. The top surfaces 301TS of the intervening conductive layers 301 may be exposed through the plug openings 411.

With reference to FIG. 18, a conductive material such as tungsten, cobalt, zirconium, tantalum, titanium, aluminum, ruthenium, copper, metal carbides, metal nitrides, or transition metal aluminides may be deposited into the plug openings 411 by a deposition process. After the deposition process, a planarization process, such as chemical mechanical polishing, may be performed to remove excess material, provide a substantially flat surface for subsequent processing steps, and conformally form the top conductive plugs 203.

FIGS. 19 to 22 illustrate, in schematic cross-sectional view diagrams, part of a flow for fabricating the semiconductor device 1C in accordance with another embodiment of the present disclosure.

Figure 19:
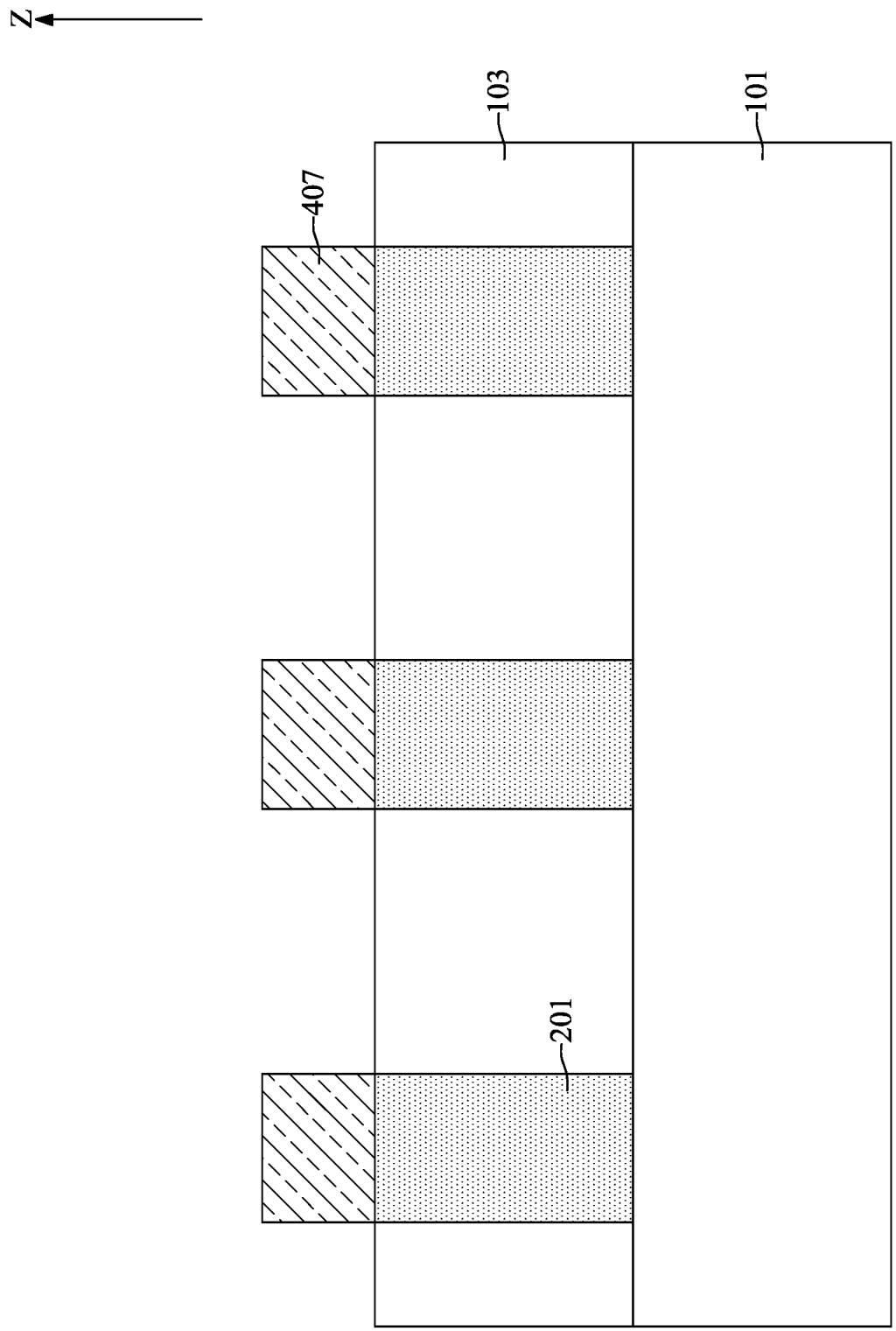
FIGS. 19 to 22 illustrate, in schematic cross-sectional view diagrams, part of a flow for fabricating the semiconductor device in accordance with another embodiment of the present disclosure.

With reference to FIG. 19, an intermediate semiconductor device illustrated in FIG. 12 may be provided. The first hard mask layer 403 may be removed.

Figure 20:
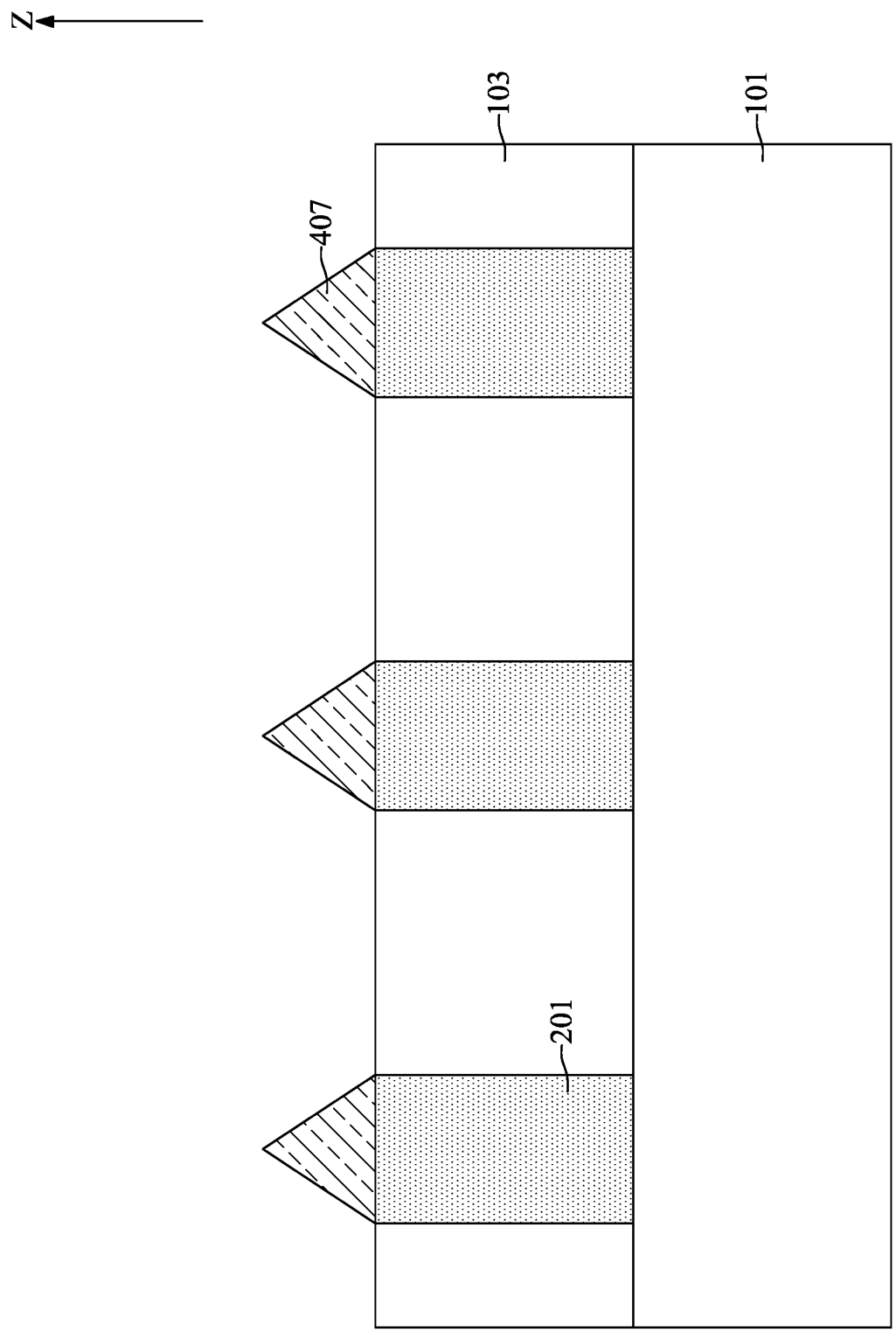

With reference to FIG. 20, a wet etching process may be subsequently performed to chamfer the semiconductor layers 407. The wet etch process may proceeded with a mixture including potassium hydroxide, isopropyl alcohol, and water in a temperature between about 80° C. to 82° C.

Figure 21:
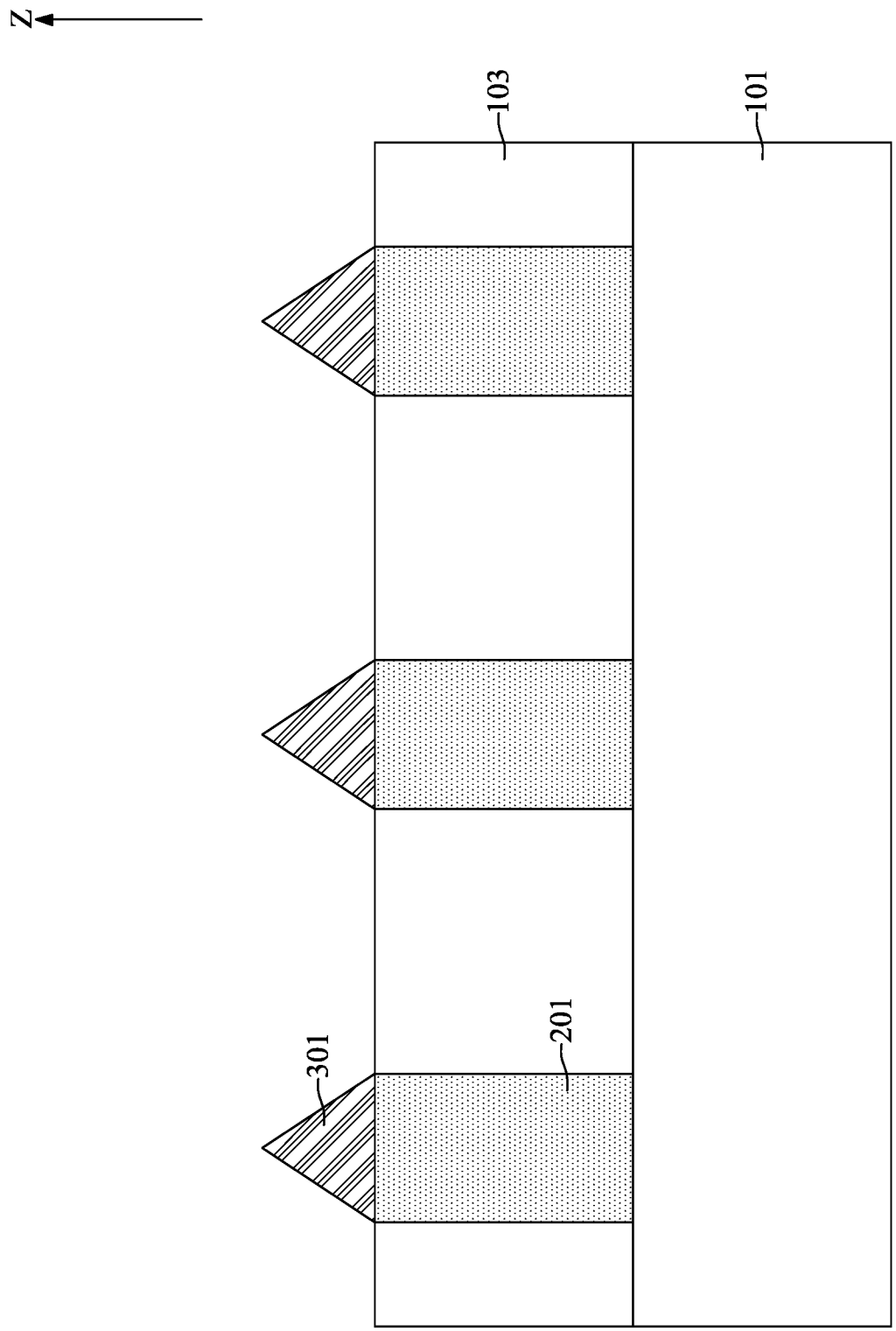

With reference to FIG. 21, the chamfered semiconductor layers 407 may be turned into intervening conductive layers 301 with a procedure similar to that illustrated in FIGS. 14 and 15.

Figure 22:
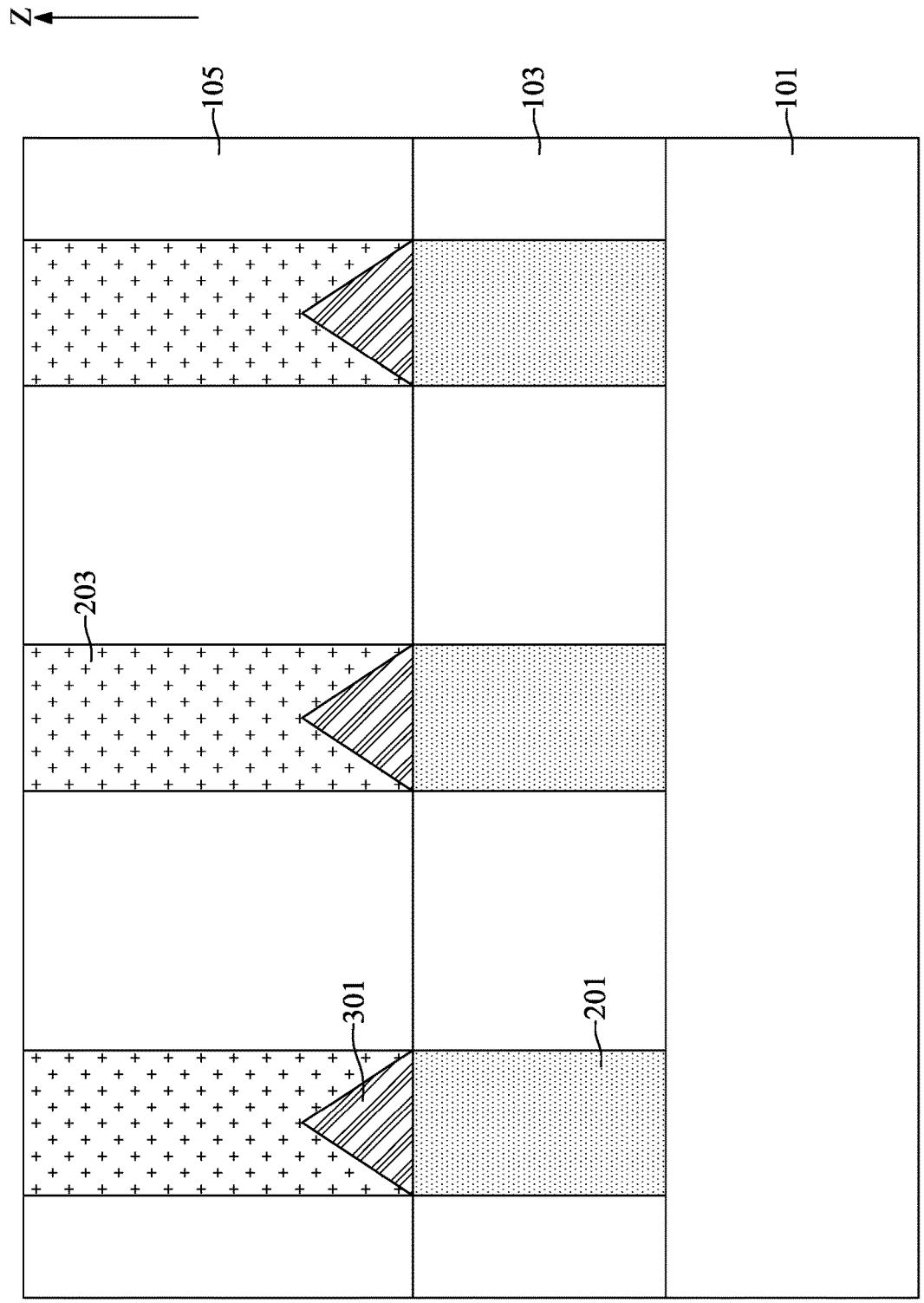

With reference to FIG. 22, the second insulating layer 105 and the top conductive plugs 203 may be formed with a procedure similar to that illustrated in FIGS. 17 and 18.

FIGS. 23 to 26 illustrate, in schematic cross-sectional view diagrams, part of a flow for fabricating the semiconductor device 1E in accordance with another embodiment of the present disclosure.

Figure 23:
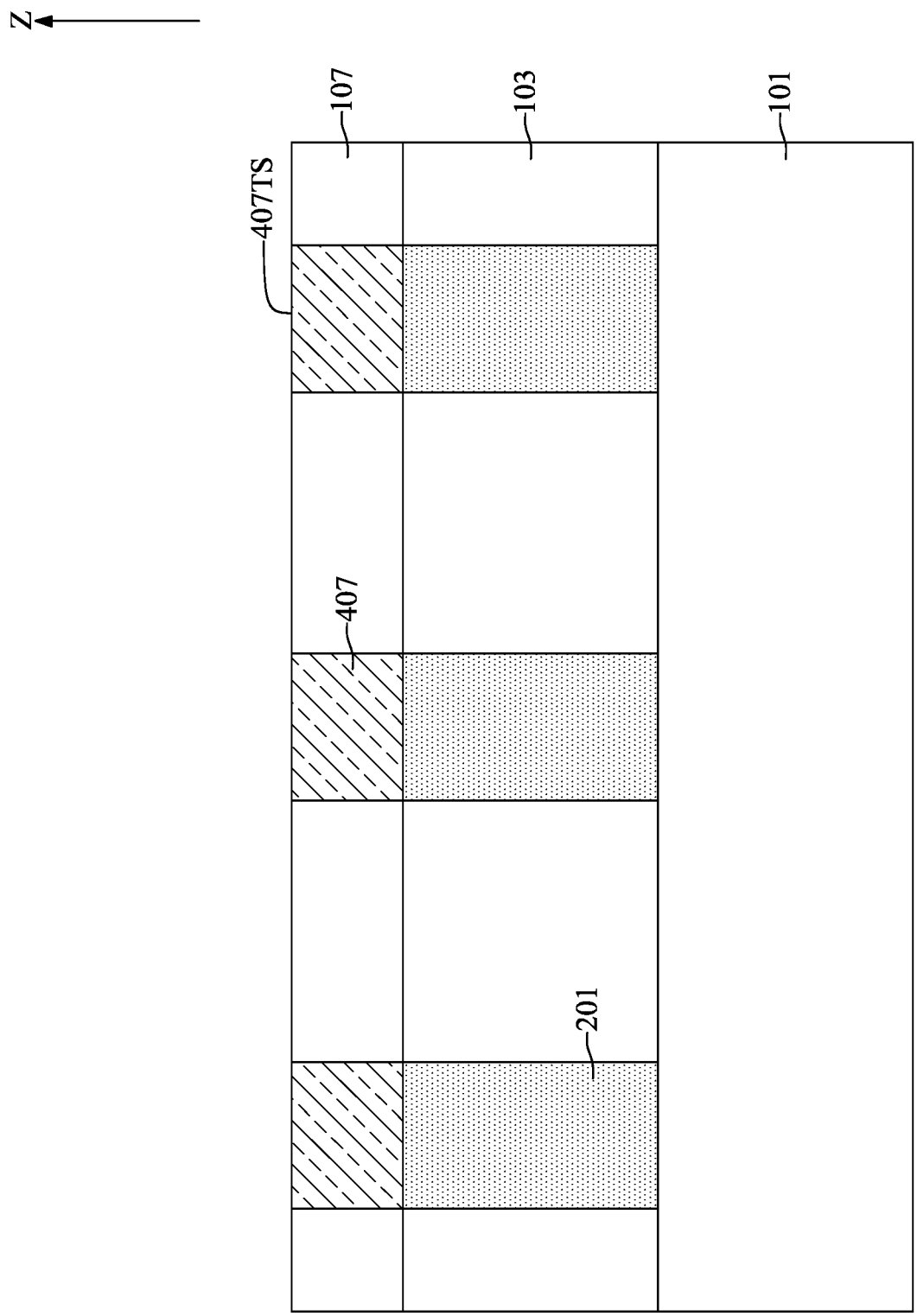
FIGS. 23 to 26 illustrate, in schematic cross-sectional view diagrams, part of a flow for fabricating the semiconductor device in accordance with another embodiment of the present disclosure.

With reference to FIG. 23, an intermediate semiconductor device illustrated in FIG. 12 may be provided. The first hard mask layer 403 may be removed. A third insulating layer 107 may be formed to cover the semiconductor layers 407. A planarization process, such as chemical mechanical polishing, may be performed until the top surfaces 407TS of the semiconductor layers 407 are exposed to provide a substantially flat surface for subsequent processing steps.

Figure 24:
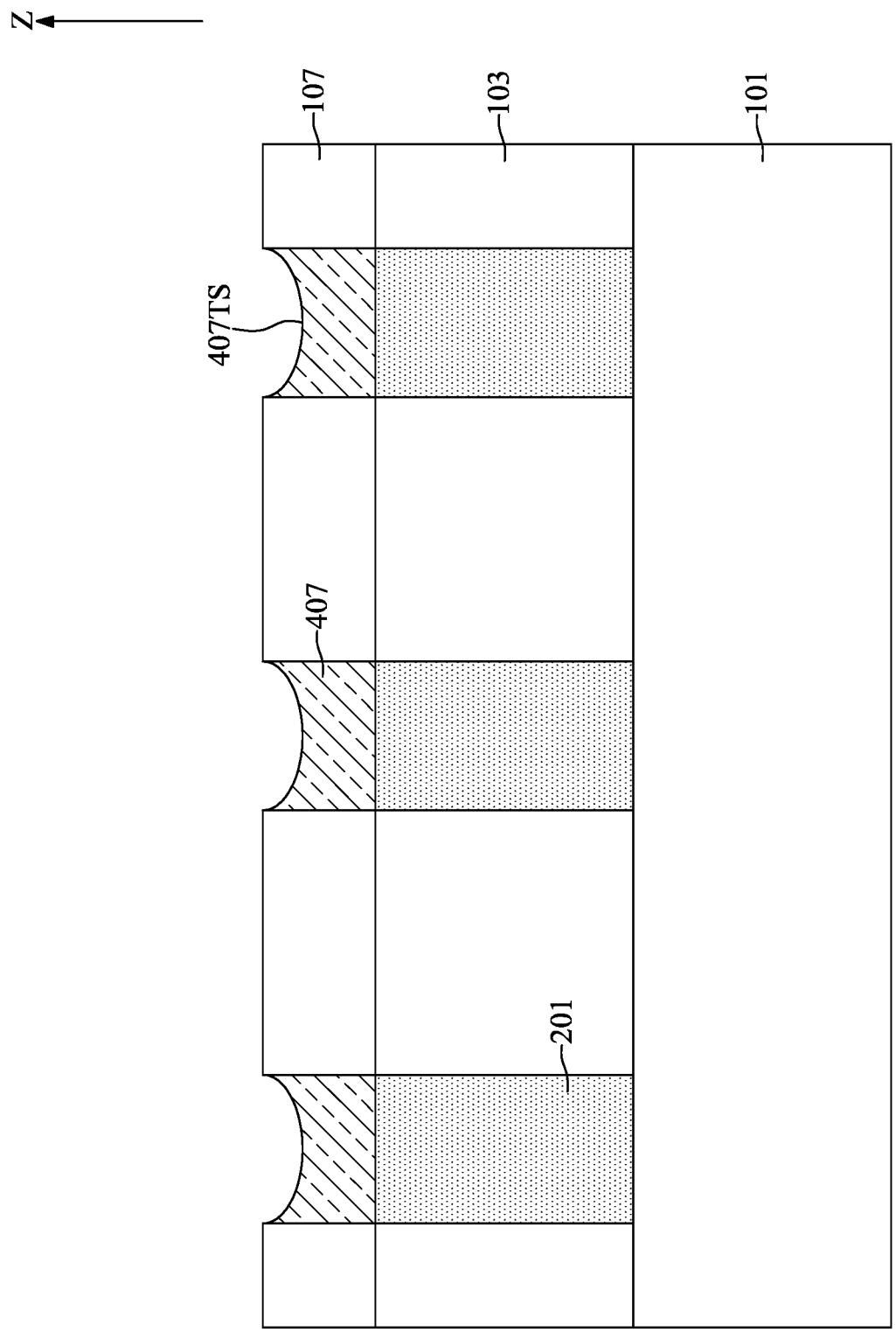

With reference to FIG. 24, an isotropic etch process may be performed to remove portions of the semiconductor layers 407 and make the top surfaces 407TS of the semiconductor layers 407 concave. The etch rate of the semiconductor layers 407 of the isotropic etch process may be faster than the etch rate of the third insulating layer 107 of the isotropic etch process. For example, an etch rate ratio of the semiconductor layers 407 to the third insulating layer 107 may be between about 100:1 and about 1.05:1 during the isotropic etch process. For another example, the etch rate ratio of the semiconductor layers 407 to the third insulating layer 107 may be between about 100:1 and about 10:1 during the isotropic etch process.

Figure 25:
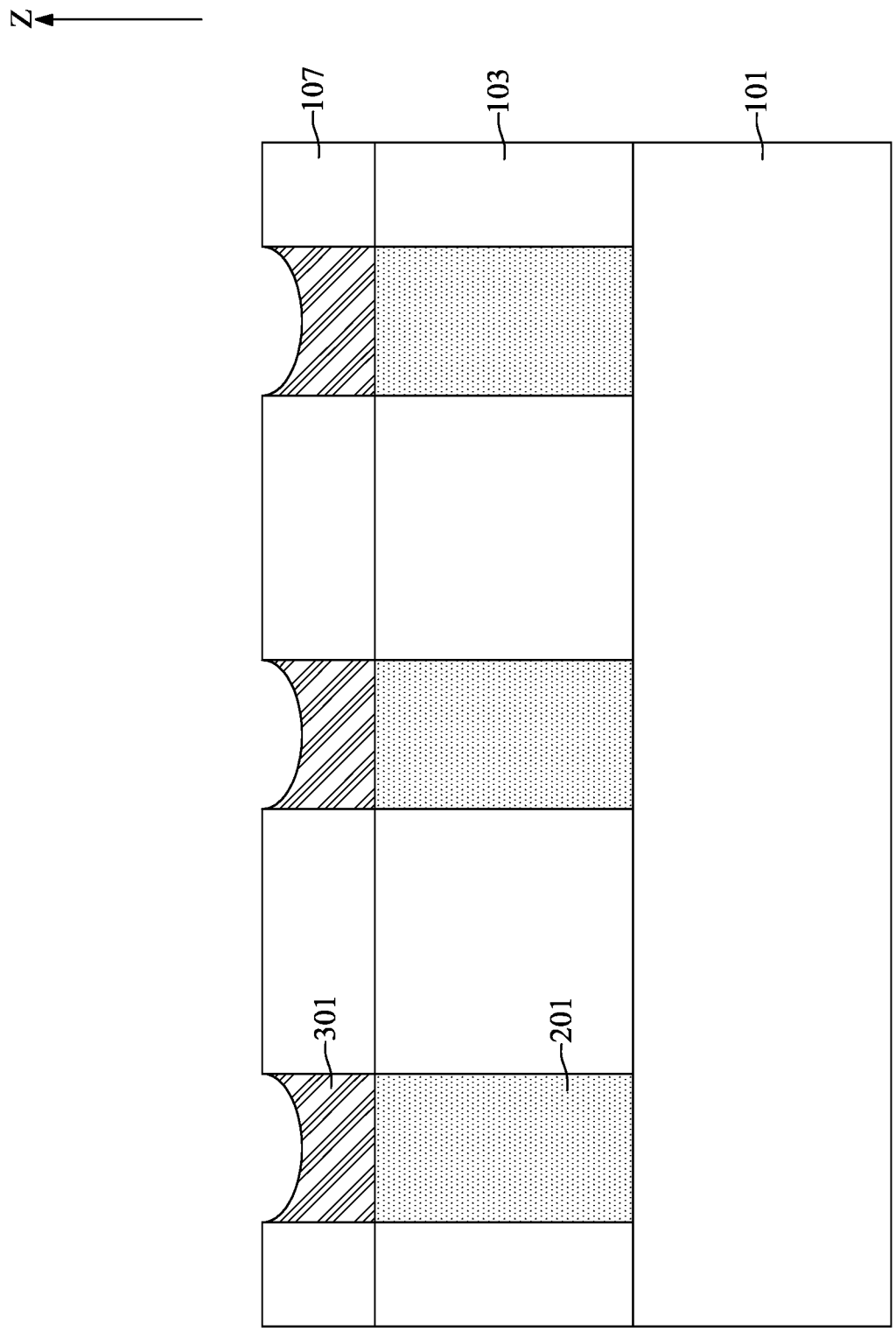

With reference to FIG. 25, the semiconductor layers 407 having concave top surfaces may be turned into intervening conductive layers 301 with a procedure similar to that illustrated in FIGS. 14 and 15.

Figure 26:
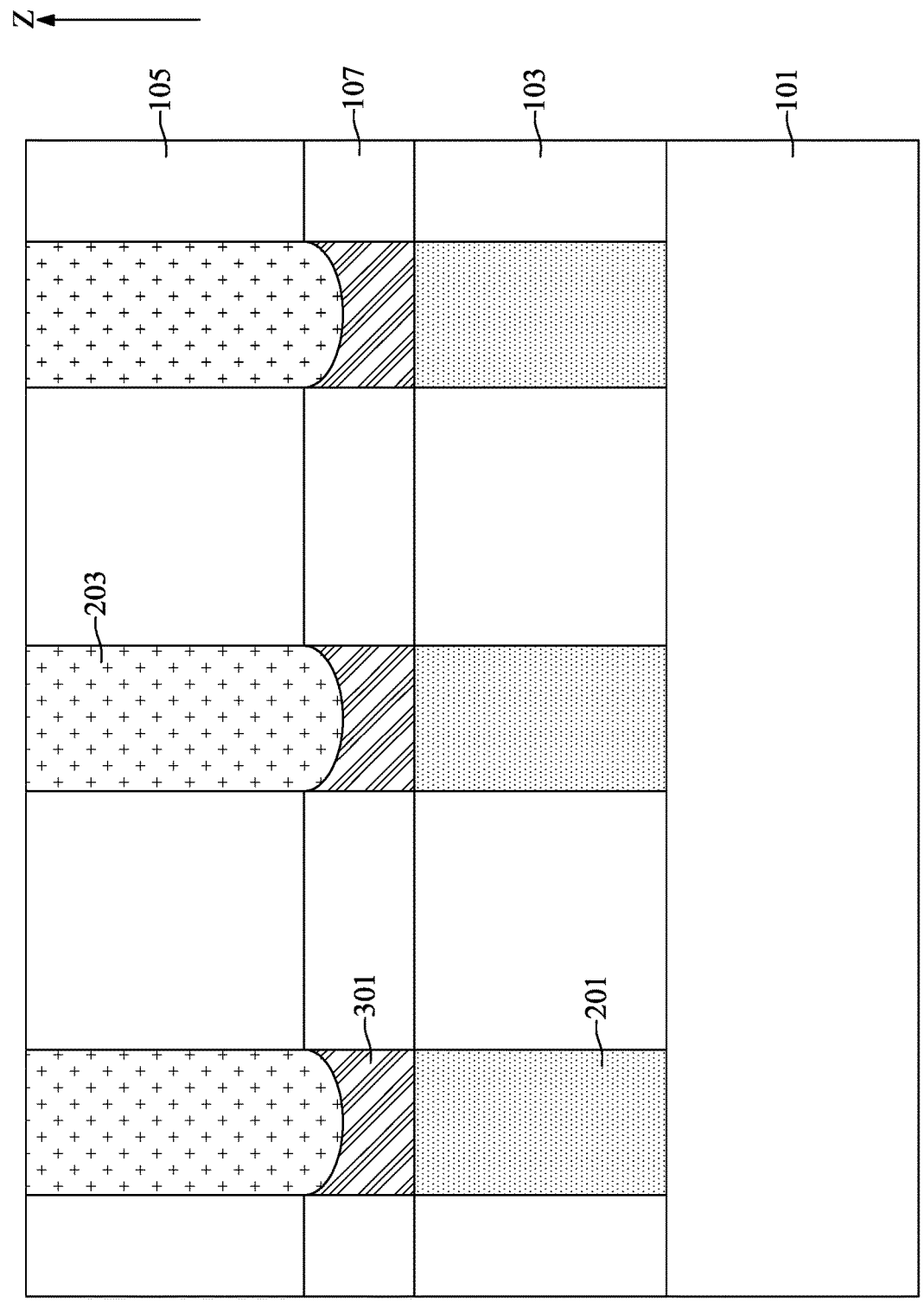

With reference to FIG. 26, the second insulating layer 105 and the top conductive plugs 203 may be formed with a procedure similar to that illustrated in FIGS. 17 and 18.

FIGS. 27 to 31 illustrate, in schematic cross-sectional view diagrams, part of a flow for fabricating the semiconductor device 1G in accordance with another embodiment of the present disclosure.

Figure 27:
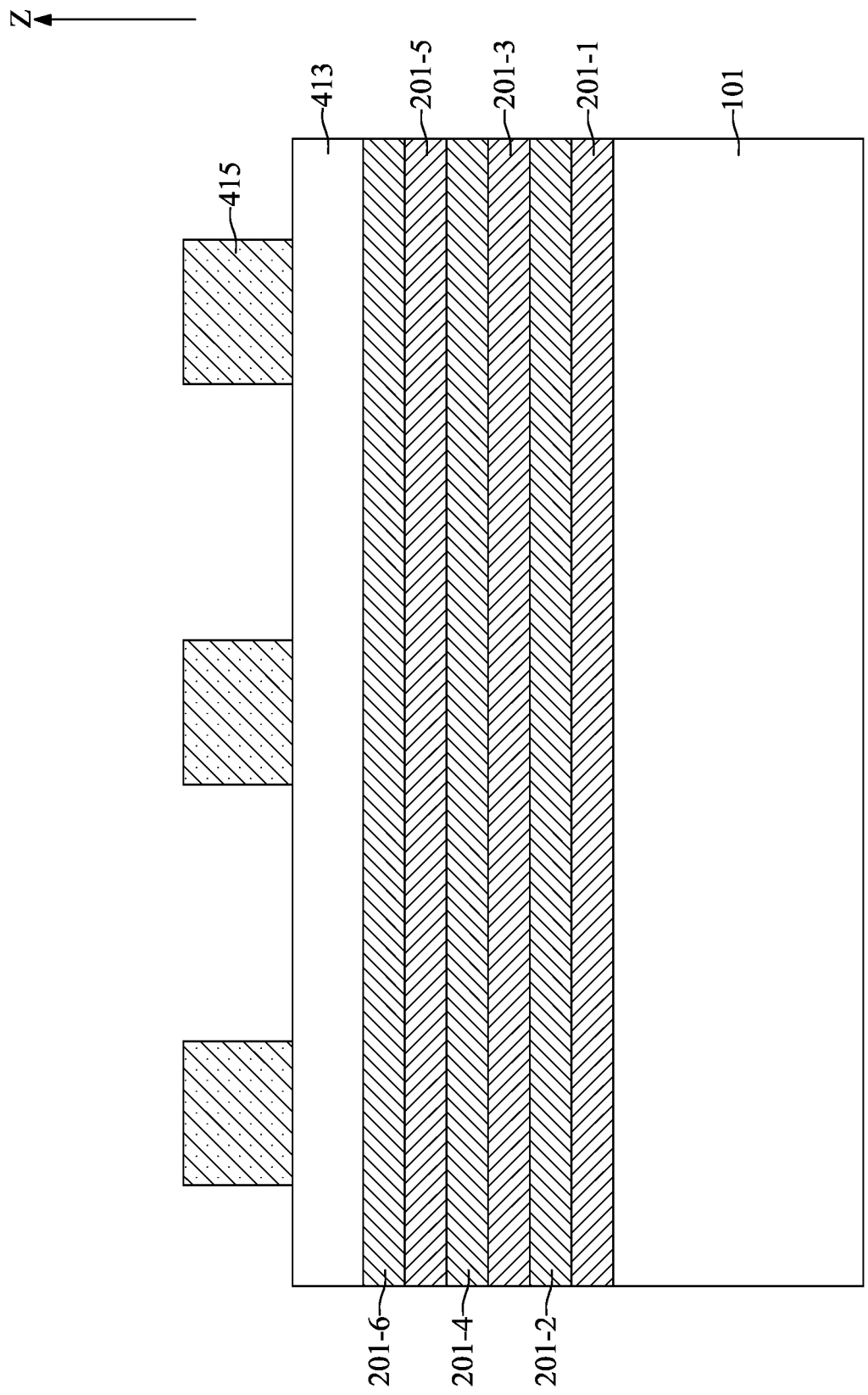
FIGS. 27 to 31 illustrate, in schematic cross-sectional view diagrams, part of a flow for fabricating the semiconductor device in accordance with another embodiment of the present disclosure.
Figure 28:
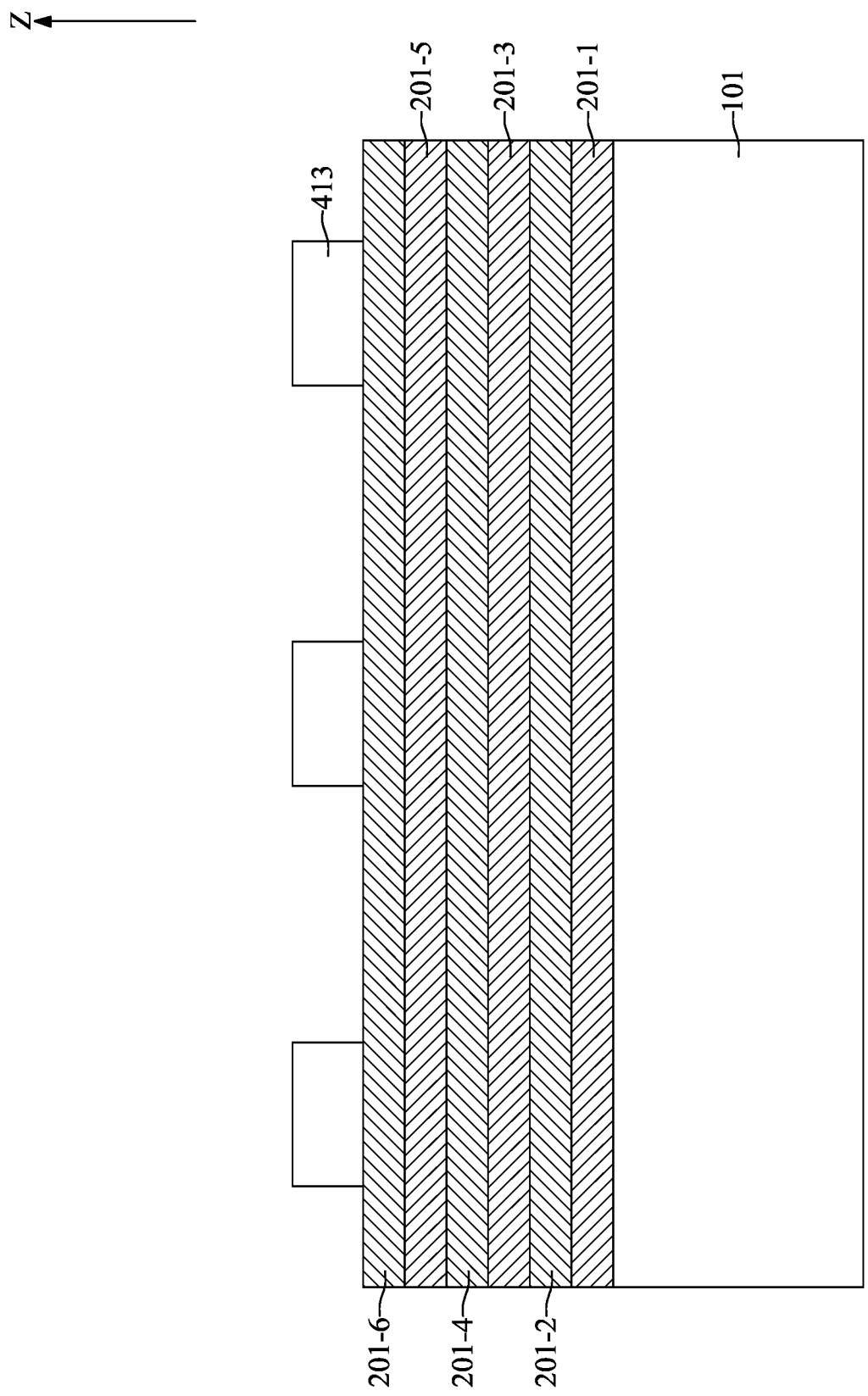

With reference to FIG. 27, the substrate 101 may be provided, plurality of first conductive layers 201-1, 201-3, 201-5 and plurality of second conductive layers 201-2, 201-4, 201-6 may be alternatively formed on the substrate 101, a second hard mask layer 413 may be formed over the plurality of first conductive layers 201-1, 201-3, 201-5 and the plurality of second conductive layers 201-2, 201-4, 201-6, and a second mask layer 415 may be formed on the second hard mask layer 413. The plurality of first conductive layers 201-1, 201-3, 201-5 and the plurality of second conductive layers 201-2, 201-4, 201-6 may be formed by chemical vapor deposition, plasma-enhanced chemical vapor deposition, physical vapor deposition, ionized physical vapor deposition, atomic layer deposition, electroplating, or electroless plating, but are not limited thereto. It should be noted that the term "stacked layers" may be used interchangeably with the plurality of first conductive layers 201-1, 201-3, 201-5 and plurality of second conductive layers 201-2, 201-4, 201-6.

In some embodiments, the plurality of first conductive layers 201-1, 201-3, 201-5 and the plurality of second conductive layers 201-2, 201-4, 201-6 may have different stress states. For example, the plurality of first conductive layers 201-1, 201-3, 201-5 may have tensile stress and the layers of plurality of second conductive layers 201-2, 201-4, 201-6 may have compressive stress, or vice versa. The stress states of the plurality of first conductive layers 201-1, 201-3, 201-5 and the plurality of second conductive layers 201-2, 201-4, 201-6 may be controlled by forming the plurality of first conductive layers 201-1, 201-3, 201-5 and the plurality of second conductive layers 201-2, 201-4, 201-6 with different materials. Specifically, the plurality of first conductive layers 201-1, 201-3, 201-5 are formed of a material having a higher stress state and the plurality of second conductive layers 201-2, 201-4, 201-6 are formed a material having a lower stress state. The plurality of second conductive layers 201-2, 201-4, 201-6 having lower stress state may have a thicker thickness than the plurality of first conductive layers 201-1, 201-3, 201-5 having higher stress state to compensate for the stress of the plurality of first conductive layers 201-1, 201-3, 201-5 having higher stress state. Specifically, the plurality of first conductive layers 201-1, 201-3, 201-5 may have thicknesses between about 5 nm and 50 nm. The plurality of second conductive layers 201-2, 201-4, 201-6 may have thicknesses between about 10 nm and about 150 nm.

For another example, the stress states of the stacked layers may be controlled by forming the stacked layers as nitrides with different nitrogen levels. Specifically, the plurality of first conductive layers 201-1, 201-3, 201-5 may be formed of nitrides having higher nitrogen level so as to have a higher stress state due to a more disrupted crystallization. In contrast, the plurality of second conductive layers 201-2, 201-4, 201-6 may be formed of nitrides having lower nitrogen level so as to have a lower stress state. The different nitrogen levels of the stacked layers may be controlled by the amount of the reactant during the deposition processes of the stacked layers.

The plurality of first conductive layers 201-1, 201-3, 201-5 and the plurality of second conductive layers 201-2, 201-4, 201-6 that have different stress states may cancel the stress of the stacked layers or at least reduce the stress of the stacked layers to a desired amount. Hence, the wafer bowing may be reduced or avoided.

In some embodiments, the plurality of first conductive layers 201-1, 201-3, 201-5 may be large grain layers and the plurality of second conductive layers 201-2, 201-4, 201-6 may be buffer layers. The large grain layers may have thicknesses between about 10 nm and about 30 nm. The buffer layers may have thicknesses between about 1 nm and about 5 nm. The buffer layers may block crystal structures of underlying large grain layers from extending upward in the direction Z to prevent the propagation of grain structure through the stacked layers. As a result, the stress of the stacked layers may be reduced. Hence, the wafer bowing may be reduced or avoided.

The second hard mask layer 413 may be formed of, for example, silicon oxide, silicon nitride, silicon oxynitride, or silicon nitride oxide. A photolithography process may be performed to transfer desired pattern to the second mask layer 415 and define a pattern of the bottom conductive plugs 201 which will be illustrated later With reference to FIG. 28, an etch process may be performed to remove the exposed portion of the second hard mask layer 413 so as to transfer the pattern of the bottom conductive plugs 201 onto the second hard mask layer 413. After the etch process, the second mask layer 415 may be removed.

Figure 29:
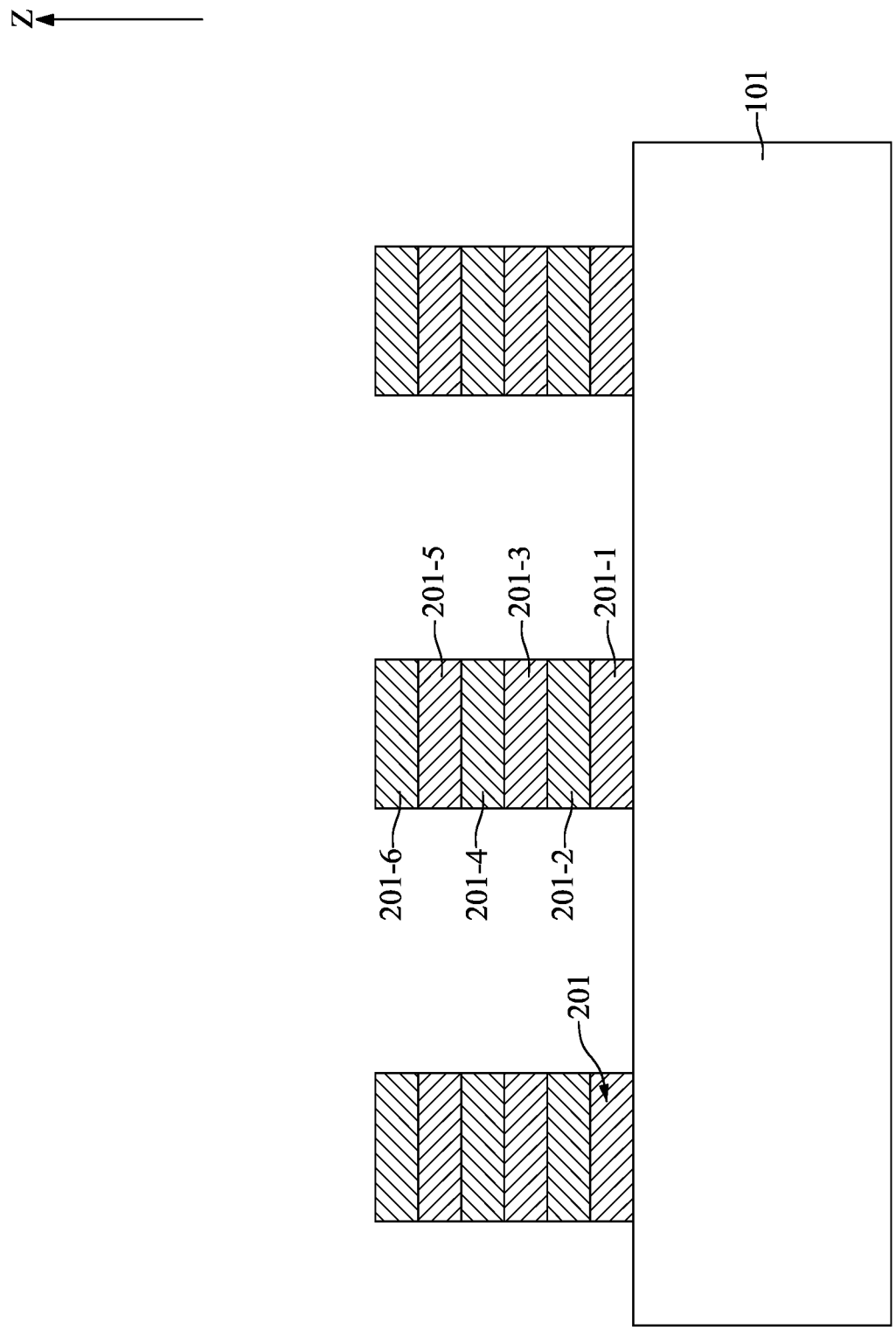

With reference to FIG. 29, an etch process may be subsequently performed to remove the exposed portions of the stacked layers. Depending on the etch selectivity of the plurality of first conductive layers 201-1, 201-3, 201-5 and the plurality of second conductive layers 201-2, 201-4, 201-6 with respect to each other, the etch process may be done either with the same chemistry to remove both the stacked layers, or cycled between processes tailored to each respective material of the plurality of first conductive layers 201-1, 201-3, 201-5 and the plurality of second conductive layers 201-2, 201-4, 201-6. For example, a fluorine-based etch may be used for removal of the exposed portions of the plurality of first conductive layers 201-1, 201-3, 201-5, and a chlorine-based etch may be used for removal of the exposed portions of the plurality of second conductive layers 201-2, 201-4, 201-6. After the etch process, the remained portions of the stacked layers may together form the bottom conductive plugs 201. The second hard mask layer 413 may be removed after the formation of the bottom conductive plugs 201.

Figure 30:
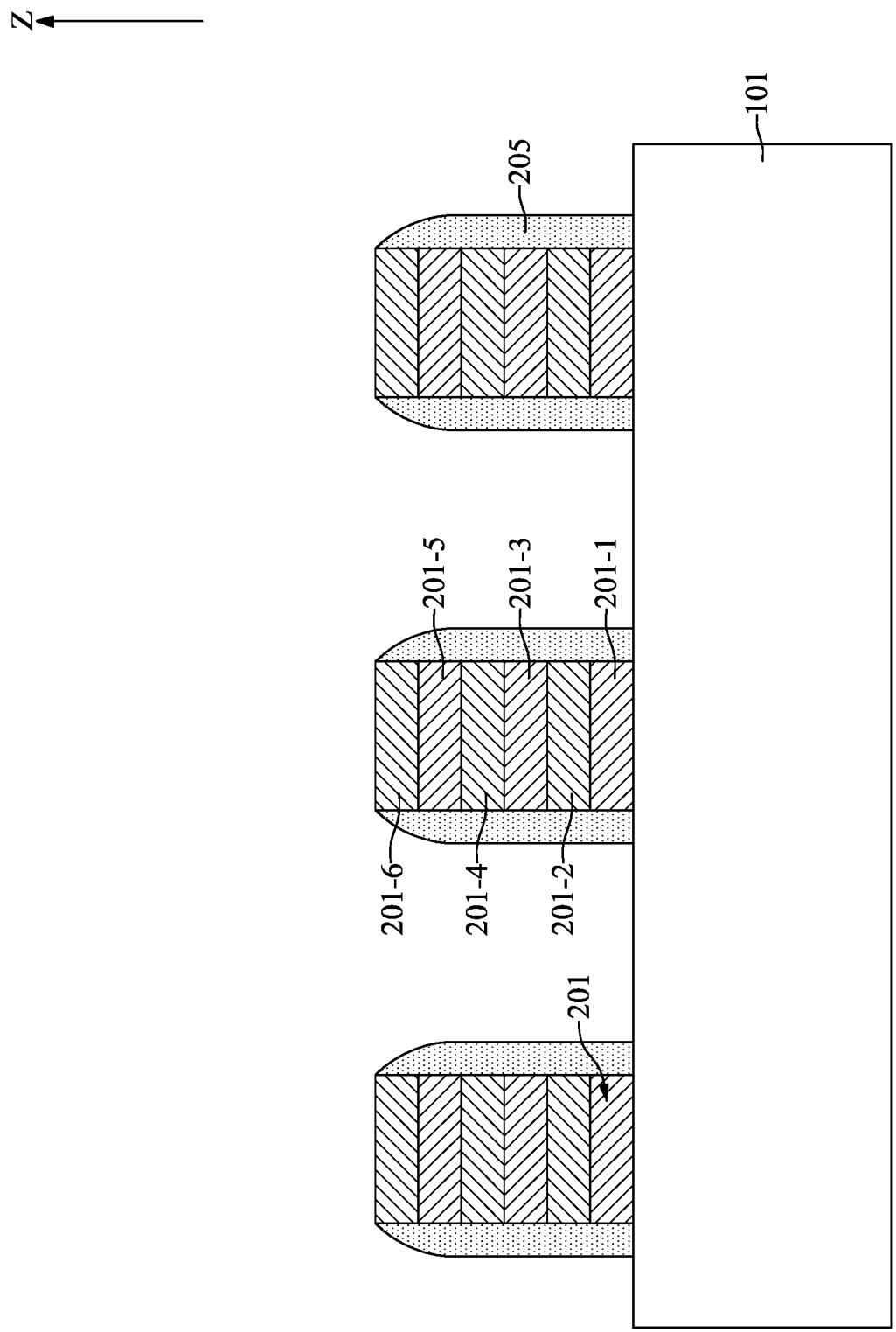

With reference to FIG. 30, spacers 205 may be formed on sides of the bottom conductive plugs 201. The spacers 205 may be formed by depositing an insulating material covering the bottom conductive plugs 201 and following with an anisotropic etch process to remove portions of the insulating material. The insulating material may be, for example, silicon oxide, silicon nitride, silicon carbon nitride, silicon nitride oxide, or silicon oxynitride.

Figure 31:
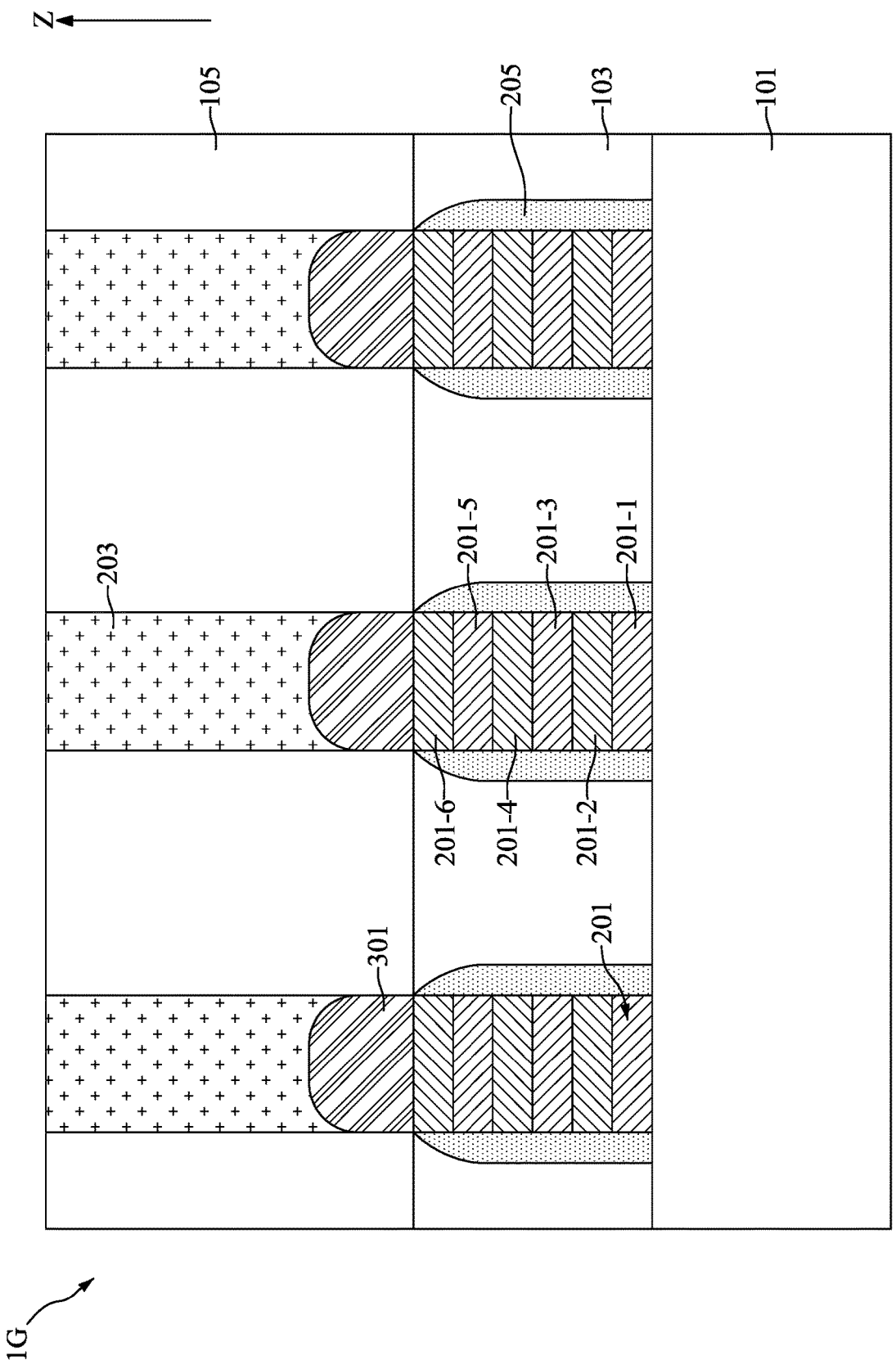

With reference to FIG. 31, the first insulating layer 103, the second insulating layer 105, the intervening conductive layers 301, and the top conductive plugs 203 may be formed with a procedure similar to that illustrated in FIGS. 10 to 18. The bottom conductive plugs 201 formed of stacked layers may be more suitable for semiconductor devices having smaller technical nodes such as 20 m, 14 nm, 7 nm, or below.

One aspect of the present disclosure provides a semiconductor device including a substrate, a bottom conductive plug positioned on the substrate, an intervening conductive layer positioned on the bottom conductive plug, and a top conductive plug positioned on the intervening conductive layer. A top surface of the intervening conductive layer is non-planar.

Another aspect of the present disclosure provides a method for fabricating a semiconductor device including providing a substrate, forming a bottom conductive plug on the substrate, forming a semiconductor layer on the bottom conductive plug, rounding a top surface of the semiconductor layer, turning the semiconductor layer into an intervening conductive layer, and forming a top conductive plug on the intervening conductive layer.

Due to the design of the semiconductor device of the present disclosure, the semiconductor device 1A including the intervening conductive layers 301 may have greater pattern density. In addition, the non-planar top surface of the intervening conductive layers 301 may also reduce the contact resistance between the intervening conductive layers 301 and the top conductive plugs 203. Accordingly, the power consumption of the semiconductor device 1A may be reduced. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:

providing a substrate;
forming a bottom conductive plug on the substrate;
forming an intervening conductive layer by the steps of:
   forming a center portion of the intervening conductive layer on the bottom conductive plug, wherein a bottom surface of the center portion is in direct contact with a top surface of the bottom conductive plug, wherein the center portion of the intervening conductive layer is formed of polycrystalline silicon, polycrystalline germanium, or polycrystalline silicon-germanium; and
   forming an outer portion of the intervening conductive layer to enclose the center portion thereof, wherein the outer portion has two ends in direct contact with the top surface of the bottom conductive plug and coplanar with the bottom surface of the center portion, wherein the outer portion of the intervening conductive layer is formed of metal silicide; and
forming a top conductive plug on the outer portion of the intervening conductive layer.

2. The method of claim 1, wherein the outer portion of the intervening conductive layer has two slanted outer sidewalls and two slanted inner sidewalls, such that the outer portion of the intervening conductive layer has an inverted V-shape.

3. The method of claim 1, wherein the center portion of the intervening conductive layer has a triangular profile.

4. The method of claim 1, wherein a top surface and a bottom surface of the outer portion of the intervening conductive layer are convex.

5. The method of claim 1, wherein a width of the center portion of the intervening conductive layer is less than a width of the outer portion thereof.

6. The method of claim 1, wherein the outer portion of the intervening conductive layer has a uniform thickness.

7. The method of claim 1, wherein the step of forming the intervening conductive layer comprises:
   forming a semiconductor layer on the bottom conductive plug;
   forming a layer of conductive material covering the semiconductor layer; and
   performing a thermal treatment to turn the semiconductor layer into the intervening conductive layer by a reaction of the layer of conductive material with the semiconductor layer.

8. The method of claim 1, wherein a bottom surface of the top conductive plug is complementary to a top surface of the outer portion of the intervening conductive layer.

* * * * *